US012284060B2

(12) United States Patent
Kikuchi et al.

(10) Patent No.: US 12,284,060 B2
(45) Date of Patent: Apr. 22, 2025

(54) SIGNAL TRANSMISSION DEVICE, ELECTRONIC DEVICE, AND VEHICLE

(71) Applicant: ROHM CO., LTD., Kyoto (JP)

(72) Inventors: Takeshi Kikuchi, Kyoto (JP); Masato Nishinouchi, Kyoto (JP); Akio Sasabe, Kyoto (JP); Daiki Yanagishima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 217 days.

(21) Appl. No.: 18/022,807

(22) PCT Filed: Sep. 15, 2021

(86) PCT No.: PCT/JP2021/033882
§ 371 (c)(1),
(2) Date: Feb. 23, 2023

(87) PCT Pub. No.: WO2022/065150
PCT Pub. Date: Mar. 31, 2022

(65) Prior Publication Data
US 2023/0318882 A1   Oct. 5, 2023

(30) Foreign Application Priority Data
Sep. 24, 2020   (JP) .................. 2020-159637

(51) Int. Cl.
*H03K 17/567*   (2006.01)
*H02M 1/08*   (2006.01)
(Continued)

(52) U.S. Cl.
CPC .......... *H04L 25/0266* (2013.01); *H02M 1/08* (2013.01); *H03K 17/567* (2013.01); *H03K 17/691* (2013.01); *H03K 19/173* (2013.01)

(58) Field of Classification Search
CPC ...... H03K 17/51; H03K 17/56; H03K 17/567; H03K 17/605; H03K 17/61; H03K 17/687; H03K 17/689; H03K 17/691
See application file for complete search history.

(56) References Cited

U.S. PATENT DOCUMENTS

2020/0350905 A1\* 11/2020 Bang ................ H03K 17/08122
2022/0208674 A1\* 6/2022 Wada .................. H01L 23/5227
(Continued)

FOREIGN PATENT DOCUMENTS

JP   H056966   1/1993
JP   H0883909   3/1996
(Continued)

OTHER PUBLICATIONS

International Search Report in International Appln. No. PCT/JP2021/033882, dated Nov. 30, 2021, 5 pages (with English Translation).

*Primary Examiner* — Jason M Crawford
(74) *Attorney, Agent, or Firm* — Fish & Richardson P.C.

(57) ABSTRACT

A signal transmission device transmits a driving signal for a gate-driving transistor between a primary circuit system and a secondary circuit system while isolating between the primary and secondary circuit systems. The signal transmission device includes: a first external terminal configured such that the ground terminal of the secondary circuit system is connected to it; a second external terminal configured such that the terminal voltage at it varies according to whether the first external terminal is in an open state; and an open detection circuit configured to monitor the terminal voltage at the second external terminal to perform open detection for the first external terminal.

11 Claims, 16 Drawing Sheets

(51) Int. Cl.
    *H03K 17/691*     (2006.01)
    *H03K 19/173*     (2006.01)
    *H04L 25/02*     (2006.01)

(56) References Cited

U.S. PATENT DOCUMENTS

| | | | | |
|---|---|---|---|---|
| 2023/0318882 | A1* | 10/2023 | Kikuchi | H03K 17/567 |
| | | | | 326/21 |
| 2023/0327662 | A1* | 10/2023 | Kikuchi | H02M 1/08 |
| | | | | 307/130 |
| 2023/0353144 | A1* | 11/2023 | Yanagishima | H02M 3/07 |
| 2023/0395454 | A1* | 12/2023 | Tanaka | H01L 27/01 |
| 2023/0420930 | A1* | 12/2023 | Ishikawa | G06F 11/0739 |
| 2023/0421050 | A1* | 12/2023 | Ishikawa | H04L 25/02 |
| 2024/0007100 | A1* | 1/2024 | Nishinouchi | H02M 1/08 |
| 2024/0021598 | A1* | 1/2024 | Tanaka | H03K 17/691 |
| 2024/0021599 | A1* | 1/2024 | Tanaka | H03K 17/691 |
| 2024/0022246 | A1* | 1/2024 | Wada | H03K 17/691 |
| 2024/0097677 | A1* | 3/2024 | Takahashi | B60R 16/03 |
| 2024/0204772 | A1* | 6/2024 | Yanagishima | H03K 17/56 |

FOREIGN PATENT DOCUMENTS

| | | |
|---|---|---|
| JP | 2009219294 | 9/2009 |
| JP | 2018011108 | 1/2018 |

\* cited by examiner

SIGNAL TRANSMISSION DEVICE, ELECTRONIC DEVICE, AND VEHICLE

CROSS REFERENCE TO RELATED APPLICATIONS

This application is a U.S. National Phase application under 35 U.S.C. § 371 of International Patent Application No. PCT/JP2021/033882, filed on Sep. 15, 2021, which claims the priority of Japanese Patent Application No. JP2020-159637, filed on Sep. 24, 2020, the disclosure of which is incorporated herein by reference in its entirety.

TECHNICAL FIELD

The invention disclosed herein relates to signal transmission devices, and to electronic devices and vehicles that incorporate signal transmission devices.

BACKGROUND ART

Conventionally, signal transmission devices that transmit a signal between a primary circuit system and a secondary circuit system while electrically isolating between the primary and secondary circuit systems are used in various applications (such as power supply devices and motor driving devices).

One example of the known technology mentioned above is seen in Patent Document 1 identified below by the present applicant.

CITATION LIST

Patent Literature

Patent Document 1: JP-A-2018-011108

SUMMARY OF INVENTION

Technical Problem

Inconveniently, conventional signal transmission devices leave room for studies in terms of GND open detection in the secondary circuit system.

Solution to Problem

In view of the above-mentioned challenge encountered by the present inventors, an object of the invention disclosed herein is to provide a signal transmission device that can detect a GND open fault in a secondary circuit system, and to provide an electronic device and a vehicle that employ such a signal transmission device.

For example, according to what is disclosed herein, a signal transmission device is configured to transmit a driving signal for a gate-driving transistor between a primary circuit system and a secondary circuit system while isolating between the primary and secondary circuit systems. The signal transmission device includes: a first external terminal configured such that the ground terminal of the secondary circuit system is connected to it; a second external terminal configured such that the terminal voltage at it varies according to whether the first external terminal is in an open state; and an open detection circuit configured to monitor the terminal voltage at the second external terminal to perform open detection with respect to the first external terminal.

Other features, elements, steps, benefits, and characteristics of the present invention will become clear through the following detailed description of embodiments in conjunction with the accompanying drawings.

Advantageous Effects of Invention

According to the invention disclosed herein, it is possible to provide a signal transmission device that can detect a GND open fault in a secondary circuit system, and to provide an electronic device and a vehicle that employ such a signal transmission device.

DESCRIPTION OF EMBODIMENTS

<Signal Transmission Device (Basic Configuration)>

Figure 1:
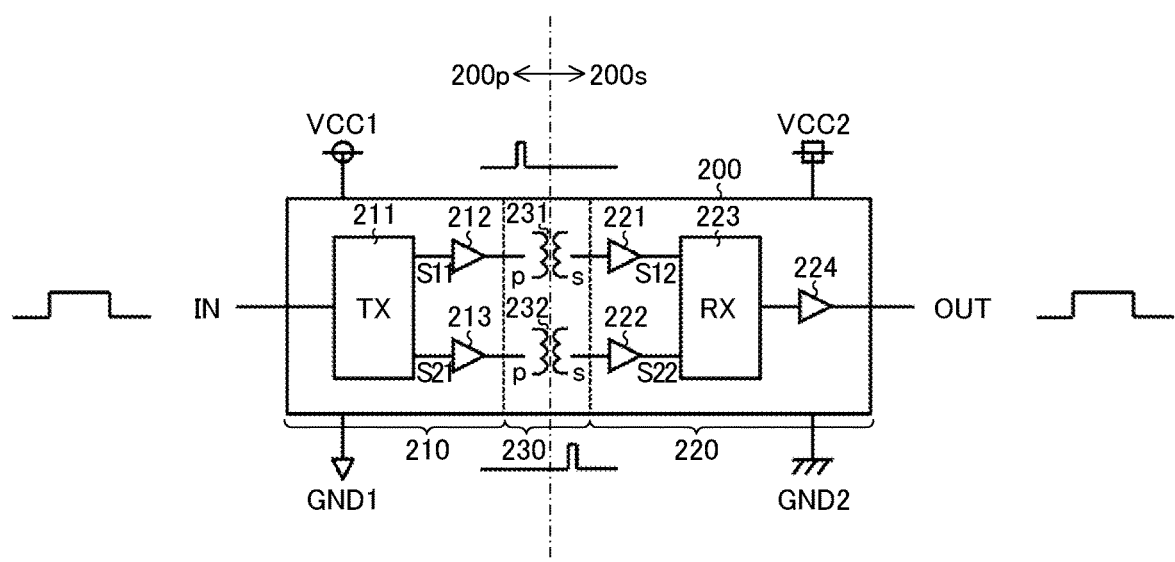
FIG. 1 is a diagram illustrating the basic configuration of a signal transmission device.

FIG. 1 is a diagram illustrating the basic configuration of a signal transmission device. The signal transmission device 200 of this configuration example is a semiconductor integrated circuit device (what is generally called an isolated gate driver IC) that, while isolating between a primary circuit system 200p (VCC1-GND1 system) and a secondary circuit system 200s (VCC2-GND2 system), transmits a pulse signal from the primary circuit system 200p to the secondary circuit system 200s to drive the gate of a switching device (unillustrated) provided in the secondary circuit system 200s. The signal transmission device 200 has, for example, a controller chip 210, a driver chip 220, and a transformer chip 230 sealed in a single package.

The controller chip 210 is a semiconductor chip that operates by being supplied with a supply voltage VCC1 (e.g., seven volts at the maximum with respect to GND1). The controller chip 210 has, for example, a pulse transmission circuit 211 and buffers 212 and 213 integrated in it.

The pulse transmission circuit 211 is a pulse generator that generates transmission pulse signals S11 and S21 according to an input pulse signal IN. More specifically, when indicating that the input pulse signal IN is at high level, the pulse transmission circuit 211 pulse-drives (outputs a single or a plurality of pulses in) the transmission pulse signal S11; when indicating that the input pulse signal IN is at low level, the pulse transmission circuit 211 pulse-drives the transmission pulse signal S21. That is, the pulse transmission circuit 211 pulse-drives either the transmission pulse signal S11 or S21 according to the logic level of the input pulse signal IN.

The buffer 212 receives the transmission pulse signal S11 from the pulse transmission circuit 211, and pulse-drives the transformer chip 230 (more specifically, a transformer 231).

The buffer 213 receives the transmission pulse signal S21 from the pulse transmission circuit 211, and pulse-drives the transformer chip 230 (more specifically, a transformer 232).

The driver chip 220 is a semiconductor chip that operates by being supplied with a supply voltage VCC2 (e.g., 30 volts at the maximum with respect to GND2). The driver chip 220 has, for example, buffers 221 and 222, a pulse reception circuit 223, and a driver 224 integrated in it.

The buffer 221 performs waveform shaping on a reception pulse signal S12 induced in the transformer chip 230 (specifically, the transformer 231), and outputs the result to the pulse reception circuit 223.

The buffer 222 performs waveform shaping on a reception pulse signal S22 induced in the transformer chip 230 (specifically, the transformer 232), and outputs the result to the pulse reception circuit 223.

According to the reception pulse signals S12 and S22 fed to it via the buffers 221 and 222, the pulse reception circuit 223 drivers the driver 224 to generate an output pulse signal OUT. More specifically, the pulse reception circuit 223 drives the driver 224 to raise the output pulse signal OUT to high level in response to the reception pulse signal S12 being pulse-driven and to drop the output pulse signal OUT to low level in response to the reception pulse signal S22 being pulse-driven. That is, the pulse reception circuit 223 switches the logic level of the output pulse signal OUT according to the logic level of the input pulse signal IN. As the pulse reception circuit 223, for example, an RS flip-flop can be suitably used.

The driver 224 generates the output pulse signal OUT under the driving and control of the pulse reception circuit 223.

The transformer chip 230, while isolating between the controller chip 210 and the driver chip 220 on a direct-current basis using the transformers 231 and 232, outputs the transmission pulse signals S11 and S21 fed to the transformer chip 230 from the pulse transmission circuit 211 to, as the reception pulse signals S12 and S22, the pulse reception circuit 223. In the present description, "isolating on a direct-current basis" means leaving two elements to be isolated from each other unconnected by a conductor.

More specifically, the transformer 231 outputs, according to the transmission pulse signal S11 fed to the primary coil 231p, the reception pulse signal S12 from the secondary coil 231s. Likewise, the transformer 232 outputs, according to the transmission pulse signal S21 fed to the primary coil 232p, the reception pulse signal S22 from the secondary coil 232s.

In this way, owing to the characteristics of spiral coils used in isolated communication, the input pulse signal IN is split into two transmission pulse signals S11 and S21 (corresponding to a rise signal and a fall signal) to be transmitted via the two transformers 231 and 232 from the primary circuit system 200p to the secondary circuit system 200s.

Note that the signal transmission device 200 of this configuration example has, separately from the controller chip 210 and the driver chip 220, the transformer chip 230 that incorporates the transformers 231 and 232 alone, and those three chips are sealed in a single package.

With this configuration, the controller chip 210 and the driver chip 220 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

The signal transmission device 200 can be employed suitably, for example, in a power supply device or motor driving device in a vehicle-mounted device incorporated in a vehicle. Such a vehicle can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

<Transformer Chip (Basic Structure)>

Figure 2:
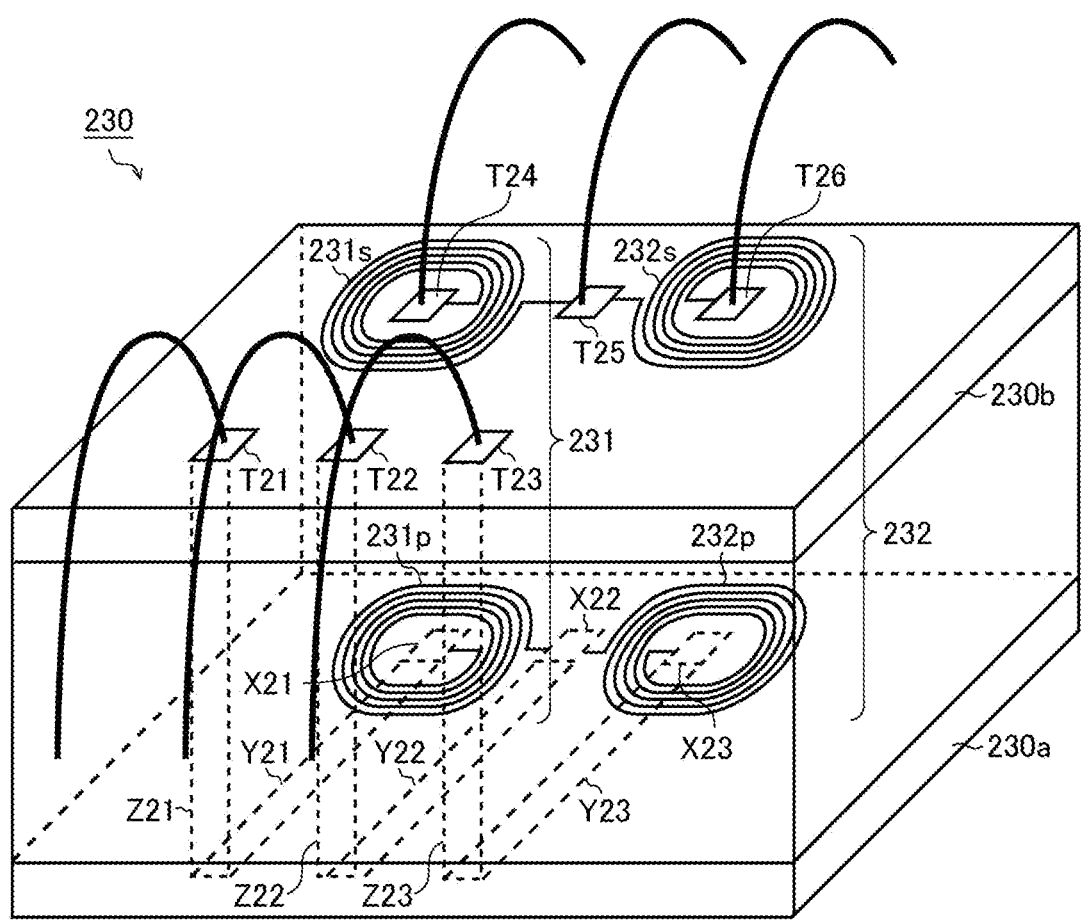
FIG. 2 is a diagram illustrating the basic structure of a transformer chip.

Next, the basic structure of the transformer chip 230 will be described. FIG. 2 is a diagram showing the basic structure of the transformer chip 230. In the transformer chip 230 shown there, the transformer 231 includes a primary coil 231p and a secondary coil 231s that face each other in the up-down direction; the transformer 232 includes a primary coil 232p and a secondary coil 232s that face each other in the up-down direction.

The primary coils 231p and 232p are both formed in a first wiring layer (lower layer) 230a in the transformer chip 230. The secondary coils 231s and 231s are both formed in a second wiring layer (the upper layer in the diagram) 230b in the transformer chip 230. The secondary coil 231s is disposed right above the primary coil 231p and faces the primary coil 231p; the secondary coil 232s is disposed right above the primary coil 232p and faces the primary coil 232p.

The primary coil 231p is laid in a spiral shape so as to encircle an internal terminal X21 clockwise, starting at the first terminal of the primary coil 231p, which is connected to the internal terminal X21. The second terminal of the primary coil 231p, which corresponds to its end point, is connected to an internal terminal X22. Likewise, the primary coil 232p is laid in a spiral shape so as to encircle an internal terminal X23 anticlockwise, starting at the first terminal of the primary coil 232p, which is connected to the internal terminal X23. The second terminal of the primary coil 232p, which corresponds to its end point, is connected to the internal terminal X22. The internal terminals X21, X22, and X23 are arrayed on a straight line in the illustrated order.

The internal terminal X21 is connected, via a wiring Y21 and a via Z21 both conductive, to an external terminal T21 in the second layer 230b. The internal terminal X22 is connected, via a wiring Y22 and a via Z22 both conductive, to an external terminal T22 in the second layer 230b. The internal terminal X23 is connected, via a wiring Y23 and a via Z23 both conductive, to an external terminal T23 in the second layer 230b. The external terminals T21 to T23 are disposed in a straight row and are used for wire-bonding with the controller chip 210.

The secondary coil 231s is laid in a spiral shape so as to encircle an external terminal T24 anticlockwise, starting at the first terminal of the secondary coil 231s, which is connected to the external terminal T24. The second terminal of the secondary coil 231s, which corresponds to its end point, is connected to an external terminal T25. Likewise, the secondary coil 232s is laid in a spiral shape so as to encircle an external terminal T26 clockwise, starting at the first terminal of the secondary coil 232s, which is connected to the external terminal T26. The second terminal of the secondary coil 232s, which corresponds to its end point, is connected to the external terminal T25. The external terminals T24, T25, and T26 are disposed in a straight row in the illustrated order and are used for wire-bonding with the driver chip 220.

The secondary coils 231s and 232s are AC-connected to the primary coils 231p and 232p, respectively, by magnetic coupling, and are DC-isolated from the primary coils 231p and 232p. That is, the driver chip 220 is AC-connected to the controller chip 210 via the transformer chip 230, and is DC-isolated from the controller chip 210 by the transformer chip 230.

<Transformer Chip (Two-Channel Type)>

Figure 3:
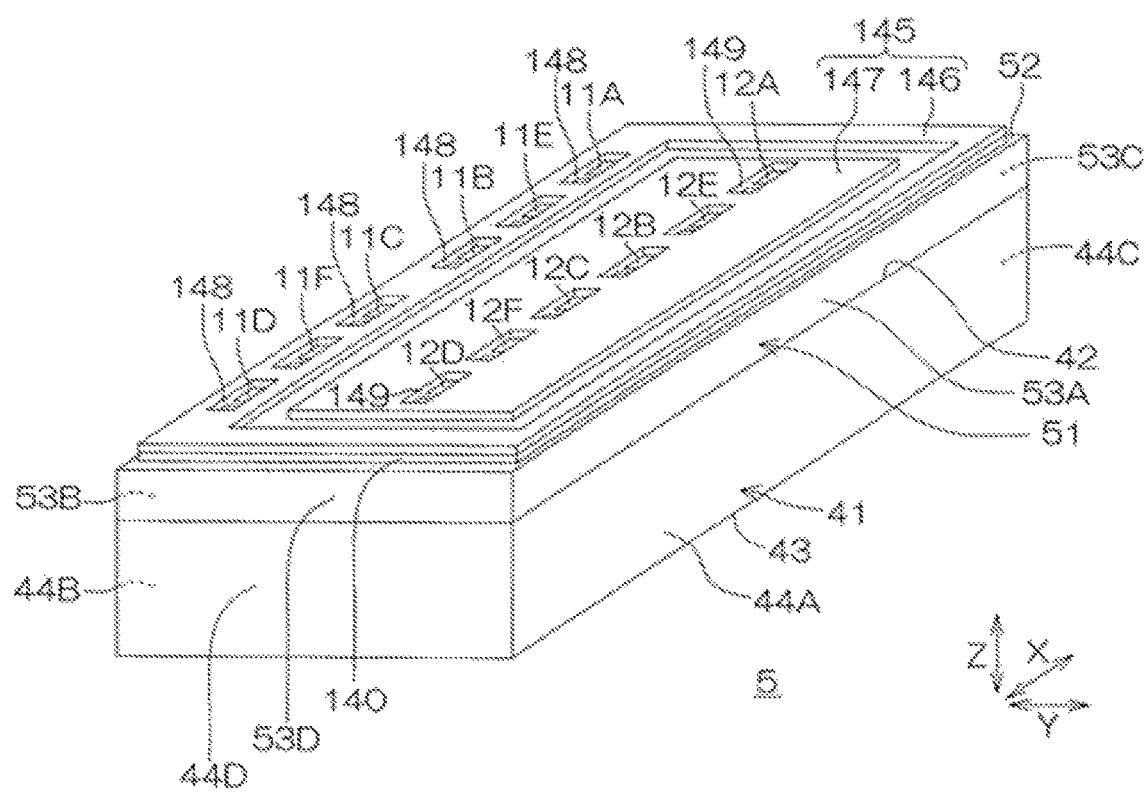
FIG. 3 a perspective view of a semiconductor device used as a two-channel transformer chip.
Figure 4:
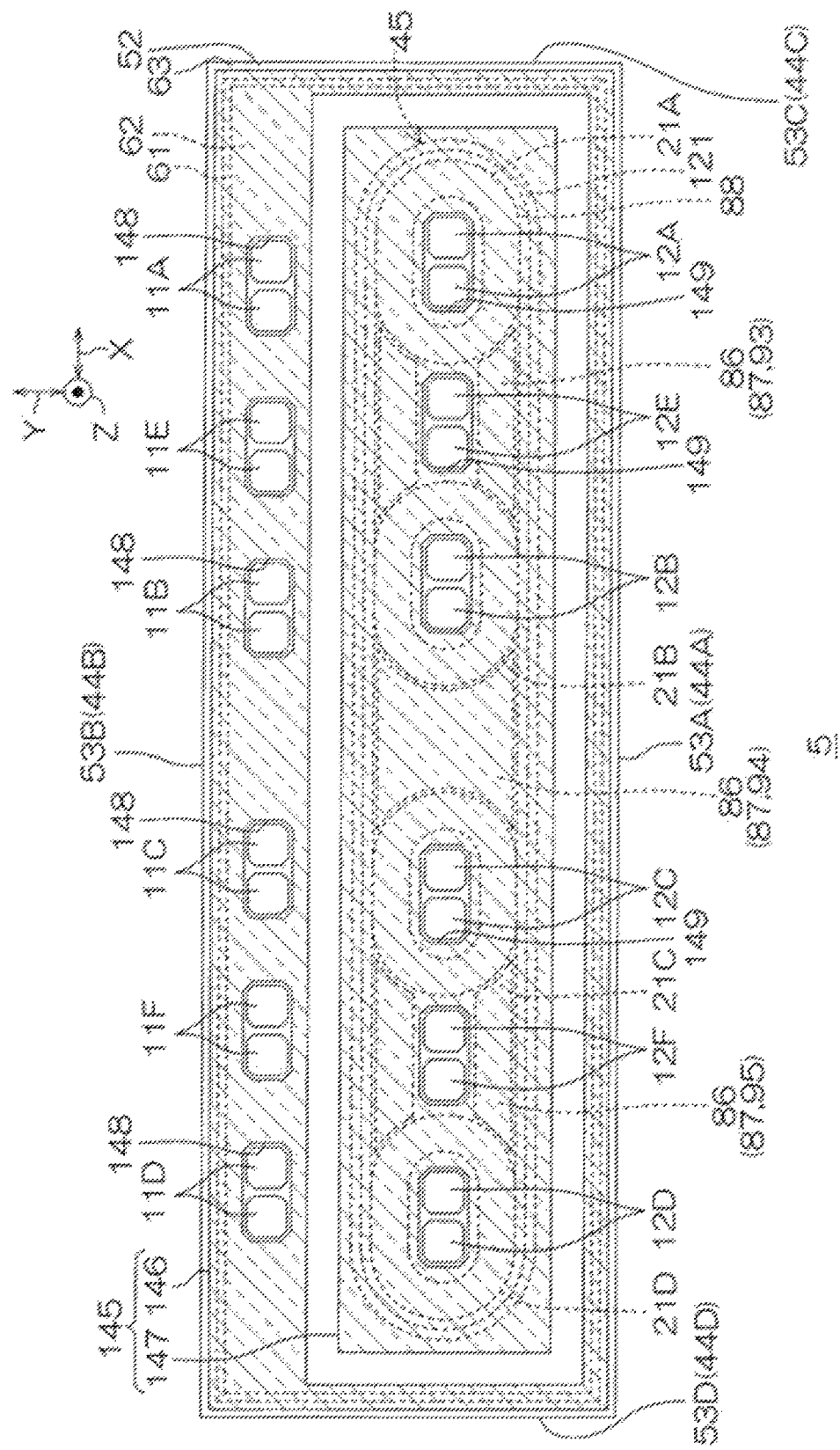
FIG. 4 is a plan view of the semiconductor device shown in FIG. 3.
Figure 5:
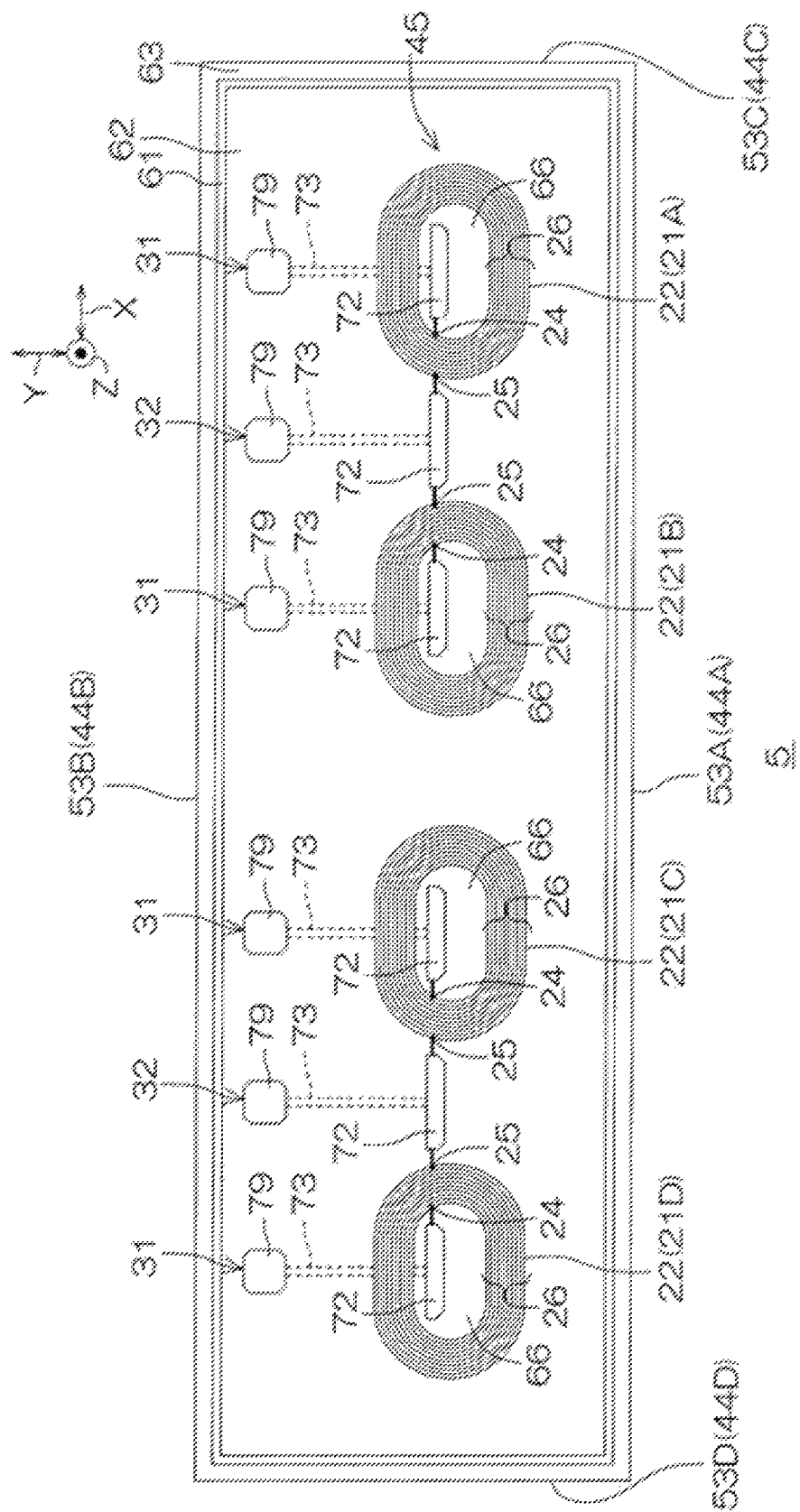
FIG. 5 is a plan view of a layer in the semiconductor device shown in FIG. 3 where low-potential coils are formed.
Figure 6:
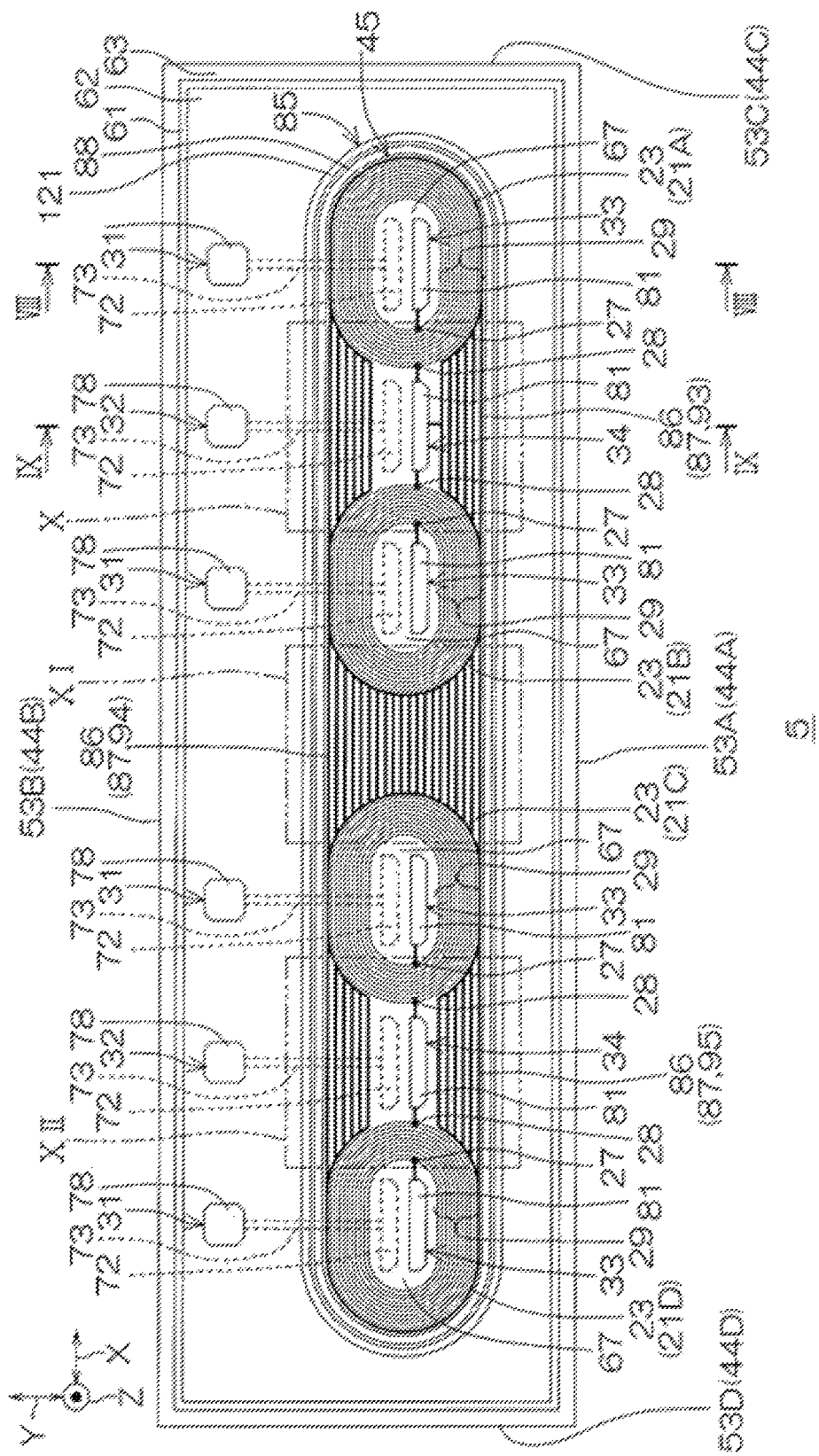
FIG. 6 is a plan view of a layer in the semiconductor device shown in FIG. 3 where high-potential coils are formed.
Figure 7:
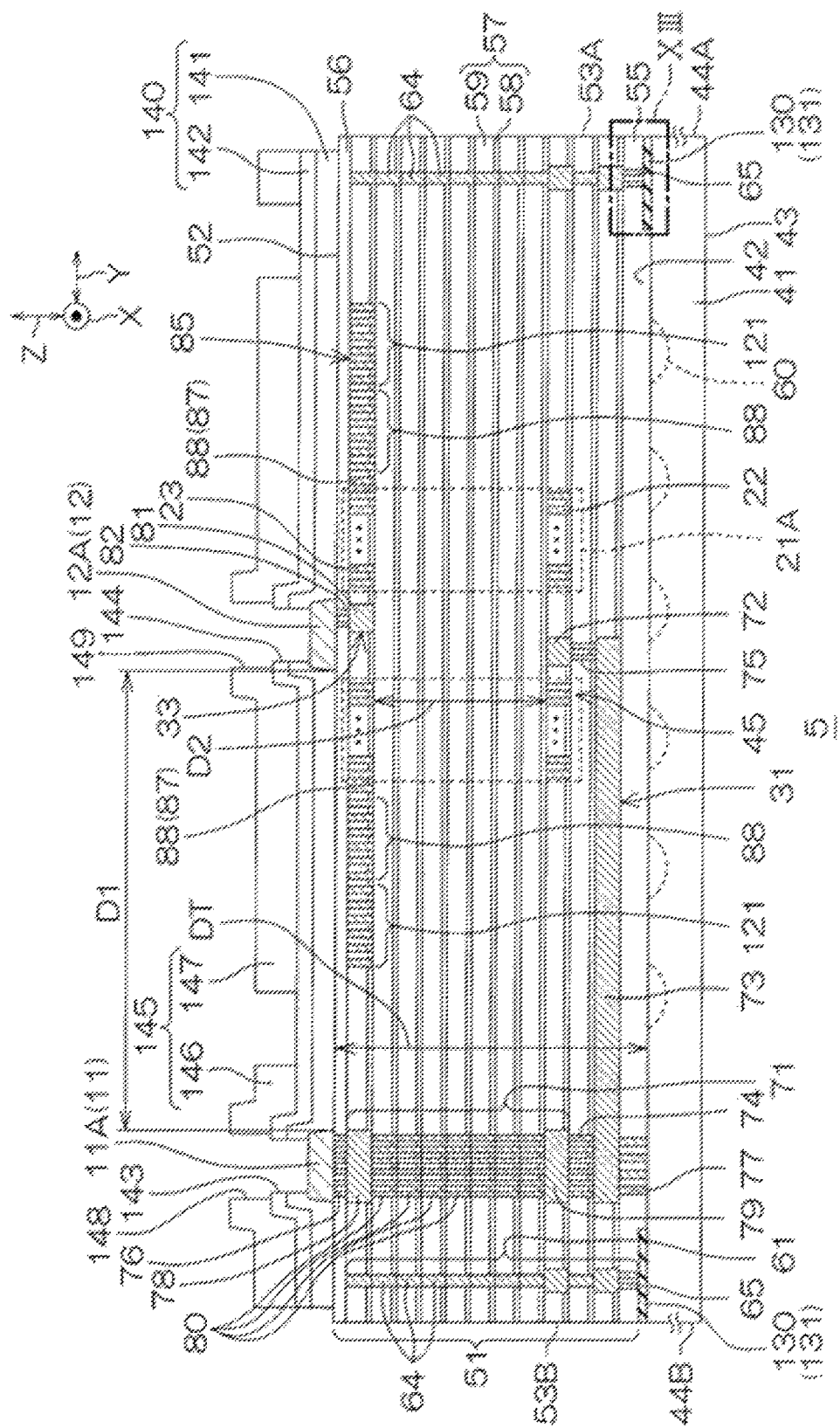
FIG. 7 is a cross-sectional view taken along line VIII-VIII shown in FIG. 6.

FIG. 3 is a perspective view of a semiconductor device 5 used as a two-channel transformer chip. FIG. 4 is a plan view of the semiconductor device 5 shown in FIG. 3. FIG. 5 is a plan view showing a layer in the semiconductor device 5 shown in FIG. 3 where low-potential coils 22 (corresponding to the primary coils of transformers) are formed. FIG. 6 is a plan view showing a layer in the semiconductor device 5 shown in FIG. 3 where high-potential coils 23 (corresponding to the secondary coils of transformers) are formed. FIG. 7 is a sectional view along line VIII-VIII shown in FIG. 6.

Referring to FIGS. 3 to 7, the semiconductor device 5 includes a semiconductor chip 41 in the shape of a rectangular parallelepiped. The semiconductor chip 41 contains at least one of silicon, a wide band gap semiconductor, and a compound semiconductor.

The wide band gap semiconductor is a semiconductor with a band gap larger than that of silicon (about 1.12 eV). Preferably, the wide band gap semiconductor has a band gap of 2.0 eV or more. The wide band gap semiconductor can be SiC (silicon carbide). The compound semiconductor can be a III-V group compound semiconductor. The compound semiconductor can contain at least one of aluminum nitride (AlN), indium nitride (InN), gallium nitride (GaN), and gallium arsenide (GaAs).

In the embodiment, the semiconductor chip 41 includes a semiconductor substrate made of silicon. The semiconductor chip 41 can be an epitaxial substrate that has a stacked structure composed of a semiconductor substrate made of silicon and an epitaxial layer made of silicon. The semiconductor substrate can be of an n-type or p-type conductivity. The epitaxial layer can be of an n-type or p-type.

The semiconductor chip 41 has a first principal surface 42 at one side, a second principal surface 43 at the other side, and chip side walls 44A to 44D that connect the first and second principal surfaces 42 and 43 together. As seen in a plan view from the normal direction Z to them (hereinafter simply expressed as "as seen in a plan view"), the first and second principal surfaces 42 and 43 are each formed in a quadrangular shape (in the embodiment, in a rectangular shape).

The chip side walls 44A to 44D includes a first chip side wall 44A, a second chip side wall 44B, a third chip side wall 44C, and a fourth chip side wall 44D. The first and second chip side walls 44A and 44B constitute the longer sides of the semiconductor chip 41. The first and second chip side walls 44A and 44B extend along a first direction X and face away from each other in a second direction Y. The third and fourth chip side walls 44C and 44D constitute the shorter sides of the semiconductor chip 41. The third and fourth chip side walls 44C and 44D extend in the second direction Y and face away from each other in the first direction X. The chip side walls 44A to 44D have polished surfaces.

The semiconductor device 5 further includes an insulation layer 51 formed on the first principal surface 42 of the semiconductor chip 41. The insulation layer 51 has an insulation principal surface 52 and insulation side walls 53A to 53D. The insulation principal surface 52 is formed in a quadrangular shape (in the embodiment, a rectangular shape) that fits the first principal surface 42 as seen in a plan view. The insulation principal surface 52 extends parallel to the first principal surface 42.

The insulation side walls 53A to 53D include a first insulation side wall 53A, a second insulation side wall 53B, a third insulation side wall 53C, and a fourth insulation side wall 53D. The insulation side walls 53A to 53D extend from the circumferential edge of the insulation principal surface 52 toward the semiconductor chip 41, and are continuous with the chip side walls 44A to 44D. Specifically, the insulation side walls 53A to 53D are formed to be flush with the chip side walls 44A to 44D. The insulation side walls 53A to 53D constitute polished surfaces that are flush with the chip side walls 44A to 44D.

The insulation layer 51 has a stacked structure of multi-layer insulation layers that include a bottom insulation layer 55, a top insulation layer 56, and a plurality of (in the embodiment, eleven) interlayer insulation layers 57. The bottom insulation layer 55 is an insulation layer that directly covers the first principal surface 42. The top insulation layer 56 is an insulation layer that constitutes the insulation principal surface 52. The plurality of interlayer insulation layers 57 are insulation layers that are interposed between the bottom and top insulation layers 55 and 56. In the embodiment, the bottom insulation layer 55 has a single-layer structure that contains silicon oxide. In the embodiment, the top insulation layer 56 has a single-layer structure that contains silicon oxide. The bottom and top insulation layers 55 and 56 can each have a thickness of 1 μm or more but 3 μm or less (e.g., about 2 μm).

The plurality of interlayer insulation layers 57 each have a stacked structure that includes a first insulation layer 58 at the bottom insulation layer 55 side and a second insulation layer 59 at the top insulation layer 56 side. The first insulation layer 58 can contain silicon nitride. The first insulation layer 58 is formed as an etching stopper layer for the second insulation layer 59. The first insulation layer 58 can have a thickness of 0.1 μm or more but 1 μm or less (e.g., about 0.3 μm).

The second insulation layer 59 is formed on top of the first insulation layer 58, and contains an insulating material different from that of the first insulation layer 58. The second insulation layer 59 can contain silicon oxide. The second insulation layer 59 can have a thickness of 1 μm or more but 3 µm or less (e.g., about 2 µm). Preferably, the second insulation layer 59 is given a thickness larger than that of the first insulation layer 58.

The insulation layer 51 can have a total thickness DT of 5 µm or more but 50 µm or less. The insulation layer 51 can have any total thickness DT and any number of interlayer insulation layers 57 stacked together, which are adjusted according to the desired dielectric strength voltage (dielectric breakdown withstand voltage). The bottom insulation layer 55, the top insulation layer 56, and the interlayer insulation layers 57 can employ any insulating material, which is thus not limited to any particular insulating material.

The semiconductor device 5 includes a first functional device 45 formed in the insulation layer 51. The first functional device 45 includes one or a plurality of (in the embodiment, a plurality of) transformers 21 (corresponding the transformers mentioned previously). That is, the semiconductor device 5 is a multichannel device that includes a plurality of transformers 21. The plurality of transformers 21 are formed in an inner part of the insulation layer 51, at intervals from the insulation side walls 53A to 53D. The plurality of transformers 21 are formed at intervals from each other in the first direction X.

Specifically, the plurality of transformers 21 include a first transformer 21A, a second transformer 21B, a third transformer 21C, and a fourth transformer 21D that are formed in this order from the insulation side wall 53C side to the insulation side wall 53D side as seen in a plan view. The plurality of transformers 21A to 21D have similar structures. In the following description, the structure of the first transformer 21A will be described as an example. No separate description will be given of the structures of the second, third, and fourth transformers 21B, 21C, and 21D, to which the description of the structure of the first transformer 21A is to be taken to apply.

Referring to FIGS. 5 to 7, the first transformer 21A includes a low-potential coil 22 and a high-potential coil 23. The low-potential coil 22 is formed in the insulation layer 51. The high-potential coil 23 is formed in the insulation layer 51 so as to face the low-potential coil 22 in the normal direction Z. In the embodiment, the low- and high-potential coils 22 and 23 are formed in a region between the bottom and top insulation layers 55 and 56 (i.e., in the plurality of interlayer insulation layer 57).

The low-potential coil 22 is formed in the insulation layer 51, at the bottom insulation layer 55 (semiconductor chip 41) side, and the high-potential coil 23 is formed in the insulation layer 51, at the top insulation layer 56 (insulation principal surface 52) side with respect to the low-potential coil 22. That is, the high-potential coil 23 faces the semiconductor chip 41 across the low-potential coil 22. The low- and high-potential coils 22 and 23 can be disposed at any places. The high-potential coil 23 can face the low-potential coil 22 across one or more interlayer insulation layers 57.

The distance between the low- and high-potential coils 22 and 23 (i.e., the number of interlayer insulation layers 57 stacked together) is adjusted appropriately according to the dielectric strength voltage and electric field strength between the low- and high-potential coils 22 and 23. In the embodiment, the low-potential coil 22 is formed in the third interlayer insulation layer 57 as counted from the bottom insulation layer 55 side. In the embodiment, the high-potential coil 23 is formed in the first interlayer insulation layer 57 as counted from the top insulation layer 56 side.

The low-potential coil 22 is embedded in the interlayer insulation layer 57 so as to penetrate the first and second insulation layers 58 and 59. The low-potential coil 22 includes a first inner end 24, a first outer end 25, and a first spiral portion 26 that is patterned in a spiral shape between the first inner and outer ends 24 and 25. The first spiral portion 26 is patterned in a spiral shape that extends in an elliptical (oval) shape as seen in a plan view. The part of the first spiral portion 26 that forms its inner circumferential edge defines a first inner region 66 that is in an elliptical shape as seen in a plan view.

The first spiral portion 26 can have a number of turns of 5 or more but 30 or less. The first spiral portion 26 can have a width of 0.1 µm or more but 5 µm or less. Preferably, the first spiral portion 26 has a width of 1 µm or more but 3 µm or less. The width of the first spiral portion 26 is defined by its width in the direction orthogonal to the spiraling direction. The first spiral portion 26 has a first winding pitch of 0.1 µm or more but 5 µm or less. Preferably, the first winding pitch is 1 µm or more but 3 µm or less. The first winding pitch is defined by the distance between two parts of the first spiral portion 26 that are adjacent to each other in the direction orthogonal to the spiraling direction.

The first spiral portion 26 can have any winding shape and the first inner region 66 can have any planar shape, which are thus not limited to those shown in FIG. 5 etc. The first spiral portion 26 can be wound in a polygonal shape, such as a triangular or quadrangular shape, or in a circular shape as seen in a plan view. The first inner region 66 can be defined, so as to fit the winding shape of the first spiral portion 26, in a polygonal shape, such as a triangular or quadrangular shape, or in a circular shape as seen in a plan view.

The low-potential coil 22 can contain at least one of titanium, titanium nitride, copper, aluminum, and tungsten. The low-potential coil 22 can have a stacked structure composed of a barrier layer and a body layer. The barrier layer defines a recessed space in the interlayer insulation layer 57. The barrier layer can contain at least one of titanium and titanium nitride. The body layer can contain at least one of copper, aluminum, and tungsten.

The high-potential coil 23 is embedded in the interlayer insulation layer 57 so as to penetrate the first and second insulation layers 58 and 59. The high-potential coil 23 includes a second inner end 27, a second outer end 28, and a second spiral portion 29 that is patterned in a spiral shape between the second inner and outer ends 27 and 28. The second spiral portion 29 is patterned in a spiral shape that extends in an elliptical (oval) shape as seen in a plan view. The part of the second spiral portion 29 that forms its inner circumferential edge defines a second inner region 67 that is in an elliptical shape as seen in a plan view in the embodiment. The second inner region 67 in the second spiral portion 29 faces the first inner region 66 in the first spiral portion 26 in the normal direction Z.

The second spiral portion 29 can have a number of turns of 5 or more but 30 or less. The number of turns of the second spiral portion 29 relative to that of the first spiral portion 26 is adjusted according to the target value of voltage boosting. Preferably, the number of turns of the second spiral portion 29 is larger than that of the first spiral portion 26. Needless to say, the number of turns of the second spiral portion 29 can be smaller than or equal to that of the first spiral portion 26.

The second spiral portion 29 can have a width of 0.1 µm or more but 5 µm or less. Preferably, the second spiral portion 29 has a width of 1 µm or more but 3 µm or less. The width of the second spiral portion 29 is defined by its width in the direction orthogonal to the spiraling direction. Preferably, the width of the second spiral portion 29 is equal to the width of the first spiral portion 26.

The second spiral portion 29 can have a second winding pitch of 0.1 µm or more but 5 µm or less. Preferably, the second winding pitch is 1 µm or more but 3 µm or less. The second winding pitch is defined by the distance between two parts of the second spiral portion 29 that are adjacent to each other in the direction orthogonal to the spiraling direction. Preferably, the second winding pitch is equal to the first winding pitch of the first spiral portion 26.

The second spiral portion 29 can have any winding shape and the second inner region 67 can have any planar shape, which are thus not limited to those shown in FIG. 6 etc. The second spiral portion 29 can be wound in a polygonal shape, such as a triangular or quadrangular shape, or in a circular shape as seen in a plan view. The second inner region 67 can be defined, so as to fit the winding shape of the second spiral portion 29, in a polygonal shape, such as a triangular or quadrangular shape, or in a circular shape as seen in a plan view.

Preferably, the high-potential coil 23 is formed of the same conductive material as the low-potential coil 22. That is, preferably, like the low-potential coil 22, the high-potential coil 23 includes a barrier layer and a body layer.

Referring to FIG. 4, the semiconductor device 5 includes a plurality of (in the diagram, twelve) low-potential terminals 11 and a plurality of (in the diagram, twelve) high-potential terminals 12. The plurality of low-potential terminals 11 are electrically connected to the low-potential coils 22 of the corresponding transformers 21A to 21D respectively. The plurality of high-potential terminals 12 are electrically connected to the high-potential coils 23 of the corresponding transformers 21A to 21D respectively.

The plurality of low-potential terminals 11 are formed on the insulation principal surface 52 of the insulation layer 51. Specifically, the plurality of low-potential terminals 11 are formed in a second insulation side wall 53B side region, at an interval from the plurality of transformers 21A to 21D in the second direction Y, and are arrayed at intervals from each other in the first direction X.

The plurality of low-potential terminals 11 include a first low-potential terminal 11A, a second low-potential terminal 11B, a third low-potential terminal 11C, a fourth low-potential terminal 11D, a fifth low-potential terminal 11E, and a sixth low-potential terminal 11F. Actually, in the embodiment, two each of the plurality of low-potential terminals 11A to 11F are formed. The plurality of low-potential terminals 11A to 11F may each include any number of terminals.

The first low-potential terminal 11A faces the first transformer 21A in the second direction Y as seen in a plan view. The second low-potential terminal 11B faces the second transformer 21B in the second direction Y as seen in a plan view. The third low-potential terminal 11C faces the third transformer 21C in the second direction Y as seen in a plan view. The fourth low-potential terminal 11D faces the fourth transformer 21D in the second direction Y as seen in a plan view. The fifth low-potential terminal 11E is formed in a region between the first and second low-potential terminals 11A and 11B as seen in a plan view. The sixth low-potential terminal 11F is formed in a region between the third and fourth low-potential terminals 11C and 11D as seen in a plan view.

The first low-potential terminal 11A is electrically connected to the first inner end 24 of the first transformer 21A (low-potential coil 22). The second low-potential terminal 11B is electrically connected to the first inner end 24 of the second transformer 21B (low-potential coil 22). The third low-potential terminal 11C is electrically connected to the first inner end 24 of the third transformer 21C (low-potential coil 22). The fourth low-potential terminal 11D is electrically connected to the first inner end 24 of the fourth transformer 21D (low-potential coil 22).

The fifth low-potential terminal 11E is electrically connected to the first outer end 25 of the first transformer 21A (low-potential coil 22) and to the first outer end 25 of the second transformer 21B (low-potential coil 22). The sixth low-potential terminal 11F is electrically connected to the first outer end 25 of the third transformer 21C (low-potential coil 22) and to the first outer end 25 of the fourth transformer 21D (low-potential coil 22).

The plurality of high-potential terminals 12 are formed on the insulation principal surface 52 of the insulation layer 51, at an interval from the plurality of low-potential terminals 11. Specifically, the plurality of high-potential terminals 12 are formed in a first insulation side wall 53A side region, at an interval from the plurality of low-potential terminals 11 in the second direction Y, and are arrayed at intervals from each other in the first direction X.

The plurality of high-potential terminals 12 are formed in regions close to the corresponding transformers 21A to 21D, respectively, as seen in a plan view. The high-potential terminals 12 being close to the transformers 21A to 21D means that, as seen in a plan view, the distance between the high-potential terminals 12 and the transformers 21 is smaller than the distance between the low-potential terminals 11 and the high-potential terminals 12.

Specifically, as seen in a plan view, the plurality of high-potential terminals 12 are formed at intervals from each other along the first direction X so as to face the plurality of transformers 21A to 21D along the first direction X. More specifically, as seen in a plan view, the plurality of high-potential terminals 12 are formed at intervals from each other along the first direction X so as to be located in the second inner regions 67 in the high-potential coils 23 and in regions between adjacent high-potential coils 23. As a result, as seen in a plan view, the plurality of high-potential terminals 12 are, along with the transformers 21A to 21D, arrayed in one row along the first direction X.

The plurality of high-potential terminals 12 include a first high-potential terminal 12A, a second high-potential terminal 12B, a third high-potential terminal 12C, a fourth high-potential terminal 12D, a fifth high-potential terminal 12E, and a sixth high-potential terminal 12F. Actually, in the embodiment, two each of the plurality of high-potential terminals 12A to 12F are formed. The plurality of high-potential terminals 12A to 12F may each include any number of terminals.

The first high-potential terminal 12A is formed in the second inner region 67 in the first transformer 21A (high-potential coil 23) as seen in a plan view. The second high-potential terminal 12B is formed in the second inner region 67 in the second transformer 21B (high-potential coil 23) as seen in a plan view. The third high-potential terminal 12C is formed in the second inner region 67 in the third transformer 21C (high-potential coil 23) as seen in a plan view. The fourth high-potential terminal 12D is formed in the second inner region 67 in the fourth transformer 21D (high-potential coil 23) as seen in a plan view. The fifth high-potential terminal 12E is formed in a region between the first and second transformers 21A and 21B as seen in a plan view. The sixth high-potential terminal 12F is formed in a region between the third and fourth transformers 21C and 21D as seen in a plan view.

The first high-potential terminal 12A is electrically connected to the second inner end 27 of the first transformer 21A (high-potential coil 23). The second high-potential terminal 12B is electrically connected to the second inner end 27 of the second transformer 21B (high-potential coil 23). The third high-potential terminal 12C is electrically connected to the second inner end 27 of the third transformer 21C (high-potential coil 23). The fourth high-potential terminal 12D is electrically connected to the second inner end 27 of the fourth transformer 21D (high-potential coil 23).

The fifth high-potential terminal 12E is electrically connected to the second outer end 28 of the first transformer 21A (high-potential coil 23) and to the second outer end 28 of the second transformer 21B (high-potential coil 23). The sixth high-potential terminal 12F is electrically connected to the second outer end 28 of the third transformer 21C (high-potential coil 23) and to the second outer end 28 of the fourth transformer 21D (high-potential coil 23).

Referring to FIGS. 5 and 7, the semiconductor device 5 includes a first low-potential wiring 31, a second low-potential wiring 32, a first high-potential wiring 33, and a second high-potential wiring 34, all formed in the insulation layer 51. Actually, in the embodiment, a plurality of first low-potential wirings 31, a plurality of second low-potential wirings 32, a plurality of first high-potential wirings 33, and a plurality of second high-potential wirings 34 are formed.

The first and second low-potential wirings 31 and 32 hold the low-potential coils 22 of the first and second transformers 21A and 21B at equal potentials. The first and second low-potential wirings 31 and 32 also hold the low-potential coils 22 of the third and fourth transformers 21C and 21D at equal potentials. In the embodiment, the first and second low-potential wirings 31 and 32 hold the low-potential coils 22 of all the transformers 21A to 21D at equal potentials.

The first and second high-potential wirings 33 and 34 hold the high-potential coils 23 of the first and second transformers 21A and 21B at equal potentials. The first and second high-potential wirings 33 and 34 also hold the high-potential coils 23 of the third and fourth transformers 21C and 21D at equal potentials. In the embodiment, the first and second high-potential wirings 33 and 34 hold the high-potential coils 23 of all the transformers 21A to 21D at equal potentials.

The plurality of first low-potential wirings 31 are electrically connected respectively to the corresponding low-potential terminals 11A to 11D and to the first inner ends 24 of the corresponding transformers 21A to 21D (low-potential coils 22). The plurality of first low-potential wirings 31 have similar structures. In the following description, the structure of the first low-potential wiring 31 connected to the first low-potential terminal 11A and to the first transformer 21A will be described as an example. No separate description will be given of the structures of the other first low-potential wirings 31, to which the description of the structure of the first low-potential wiring 31 connected to the first transformer 21A is to be taken to apply.

The first low-potential wiring 31 includes a through wiring 71, a low-potential connection wiring 72, a lead wiring 73, a first connection plug electrode 74, a second connection plug electrode 75, one or a plurality of (in this embodiment, a plurality of) pad plug electrodes 76, and one or a plurality of (in this embodiment, a plurality of) substrate plug electrodes 77.

Preferably, the through wiring 71, the low-potential connection wiring 72, the lead wiring 73, the first connection plug electrode 74, the second connection plug electrode 75, the pad plug electrodes 76, and the substrate plug electrodes 77 are formed of the same conductive material as the low-potential coil 22 and the like. That is, preferably, like the low-potential coil 22 and the like, the through wiring 71, the low-potential connection wiring 72, the lead wiring 73, the first connection plug electrode 74, the second connection plug electrode 75, the pad plug electrodes 76, and the substrate plug electrodes 77 each include a barrier layer and a body layer.

The through wiring 71 penetrates a plurality of interlayer insulation layers 57 in the insulation layer 51 and extends in a columnar shape along the normal direction Z. In the embodiment, the through wiring 71 is formed in a region between the bottom and top insulation layers 55 and 56 in the insulation layer 51. The through wiring 71 has a top end part at the top insulation layer 56 side and a bottom end part at the bottom insulation layer 55 side. The top end part of the through wiring 71 is formed in the same interlayer insulation layer 57 as the high-potential coil 23, and is covered by the top insulation layer 56. The bottom end part of the through wiring 71 is formed in the same interlayer insulation layer 57 as the low-potential coil 22.

In the embodiment, the through wiring 71 includes a first electrode layer 78, a second electrode layer 79, and a plurality of wiring plug electrodes 80. In the through wiring 71, the first and second electrode layers 78 and 79 and the wiring plug electrodes 80 are formed of the same conductive material as the low-potential coil 22 and the like. That is, like the low-potential coil 22 and the like, the first and second electrode layers 78 and 79 and the wiring plug electrodes 80 each include a barrier layer and a body layer.

The first electrode layer 78 constitutes the top end part of the through wiring 71. The second electrode layer 79 constitutes the bottom end part of the through wiring 71. The first electrode layer 78 is formed as an island, and faces the low-potential terminal 11 (first low-potential terminal 11A) in the normal direction Z. The second electrode layer 79 is formed as an island, and faces the first electrode layer 78 in the normal direction Z.

The plurality of wiring plug electrodes 80 are embedded respectively in the plurality of interlayer insulation layers 57 located in a region between the first and second electrode layers 78 and 79. The plurality of wiring plug electrodes 80 are stacked together from the bottom insulation layer 55 to the top insulation layer 56 so as to be electrically connected together, and electrically connect together the first and second electrode layers 78 and 79. The plurality of wiring plug electrodes 80 each have a plane area smaller than the plane area of either of the first and second electrode layers 78 and 79.

The number of layers stacked in the plurality of wiring plug electrodes 80 is equal to the number of layers stacked in the plurality of interlayer insulation layer 57. In the embodiment, six wiring plug electrodes 80 are embedded in interlayer insulation layers 57 respectively, and any number of wiring plug electrodes 80 can be embedded in interlayer insulation layers 57 respectively. Needless to say, one or a plurality of wiring plug electrodes 80 can be formed that penetrates a plurality of interlayer insulation layers 57.

The low-potential connection wiring 72 is formed in the same interlayer insulation layer 57 as the low-potential coil 22, in the first inner region 66 in the first transformer 21A (low-potential coil 22). The low-potential connection wiring 72 is formed as an island, and faces the high-potential terminal 12 (first high-potential terminal 12A) in the normal direction Z. Preferably, the low-potential connection wiring 72 has a plane area larger than the plane area of the wiring plug electrode 80. The low-potential connection wiring 72 is electrically connected to the first inner end 24 of the low-potential coil 22.

The lead wiring 73 is formed in the interlayer insulation layer 57, in a region between the semiconductor chip 41 and the through wiring 71. In the embodiment, the lead wiring 73 is formed in the first interlayer insulation layer 57 as counted from the bottom insulation layer 55. The lead wiring 73 has a first end part at one side, a second end part at the other side, and a wiring part that connects together the first and second end parts. The first end part of the lead wiring 73 is located in a region between the semiconductor chip 41 and the bottom end part of the through wiring 71. The second end part of the lead wiring 73 is located in a region between the semiconductor chip 41 and the low-potential connection wiring 72. The wiring part extends along the first principal surface 42 of the semiconductor chip 41, and extends in the shape of a stripe in a region between the first and second end parts.

The first connection plug electrode 74 is formed in the interlayer insulation layer 57, in a region between the through wiring 71 and the lead wiring 73, and is electrically connected to the through wiring 71 and to the first end part of the lead wiring 73. The second connection plug electrode 75 is formed in the interlayer insulation layer 57, in a region between the low-potential connection wiring 72 and the lead wiring 73, and is electrically connected to the low-potential connection wiring 72 and to the second end part of the lead wiring 73.

The plurality of pad plug electrodes 76 are formed in the top insulation layer 56, in a region between the low-potential terminal 11 (first low-potential terminal 11A) and the through wiring 71, and are electrically connected to the low-potential terminal 11 and to the top end part of the through wiring 71. The plurality of substrate plug electrodes 77 are formed in the bottom insulation layer 55, in a region between the semiconductor chip 41 and the lead wiring 73. In the embodiment, the substrate plug electrodes 77 are formed in a region between the semiconductor chip 41 and the first end part of the lead wiring 73, and are electrically connected to the semiconductor chip 41 and to the first end part of the lead wiring 73.

Referring to FIGS. 6 and 7, the plurality of first high-potential wirings 33 are connected respectively to the corresponding high-potential terminals 12A to 12D and to the second inner ends 27 of the corresponding transformers 21A to 21D (high-potential coils 23). The plurality of first high-potential wirings 33 have similar structures. In the following description, the structure of the first high-potential wiring 33 connected to the first high-potential terminal 12A and to the first transformer 21A will be described as an example. No description will be given of the structures of the other first high-potential wirings 33, to which the description of the structure of the first high-potential wiring 33 connected to the first transformer 21A is to be taken to apply.

The first high-potential wiring 33 includes a high-potential connection wiring 81 and one or a plurality of (in this embodiment, a plurality of) pad plug electrodes 82. Preferably, the high-potential connection wiring 81 and the pad plug electrodes 82 are formed of the same conductive material as the low-potential coil 22 and the like. That is, preferably, like the low-potential coil 22 and the like, the high-potential connection wiring 81 and the pad plug electrodes 82 each include a barrier layer and a body layer.

The high-potential connection wiring 81 is formed in the same interlayer insulation layer 57 as the high-potential coil 23, in the second inner region 67 in the high-potential coil 23. The high-potential connection wiring 81 is formed as an island, and faces the high-potential terminal 12 (first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 as seen in a plan view, and does not face the low-potential connection wiring 72 in the normal direction Z. This results in an increased insulation distance between the low- and high-potential connection wirings 72 and 81 and hence an increased dielectric strength voltage in the insulation layer 51.

The plurality of pad plug electrodes 82 are formed in the top insulation layer 56, in a region between the high-potential terminal 12 (first high-potential terminal 12A) and the high-potential connection wiring 81, and are electrically connected to the high-potential terminal 12 and to the high-potential connection wiring 81. The plurality of pad plug electrodes 82 each have a plane area smaller than the plane area of the high-potential connection wiring 81 as seen in a plan view.

Referring to FIG. 7, preferably, the distance D1 between the low- and high-potential terminals 11 and 12 is larger than the distance D2 between the low- and high-potential coils 22 and 23 (D2<D1). Preferably, the distance D1 is larger than the total thickness DT of the plurality of interlayer insulation layers 57 (DT<D1). The ratio D2/D1 of the distance D2 to the distance D1 can be 0.01 or more but 0.1 or less. Preferably, the distance D1 is 100 μm or more but 500 μm or less. The distance D2 can be 1 μm or more but 50 μm or less. Preferably, the distance D2 is 5 μm or more but 25 μm or less. The distances D1 and D2 can have any values, which are adjusted appropriately according to the desired dielectric strength voltage.

Referring to FIGS. 6 and 7, the semiconductor device 5 has a dummy pattern 85 that is embedded in the insulation layer 51 so as to be located around the transformers 21A to 21D as seen in a plan view.

The dummy pattern 85 is formed in a pattern different (discontinuous) from that of either of the high- and low-potential coils 23 and 22, and is independent of the transformers 21A to 21D. That is, the dummy pattern 85 does not function as part of the transformers 21A to 21D. The dummy pattern 85 is formed as a shield conductor layer that shields electric fields between the low- and high-potential coils 22 and 23 in the transformers 21A to 21D to suppress electric field concentration on the high-potential coil 23. In the embodiment, the dummy pattern 85 is patterned at a line density per unit area that is equal to the line density of the high-potential coil 23. The line density of the dummy pattern 85 being equal to the line density of the high-potential coil 23 means that the line density of the dummy pattern 85 falls within the range of ±20% of the line density of the high-potential coil 23.

The dummy pattern 85 can be formed at any depth in the insulation layer 51, which is adjusted according to the electric field strength to be attenuated. Preferably, the dummy pattern 85 is formed in a region closer to the high-potential coil 23 than to the low-potential coil 22 with respect to the normal direction Z. The dummy pattern 85 being closer to the high-potential coil 23 with respect to the normal direction Z means that, with respect to the normal direction Z, the distance between the dummy pattern 85 and the high-potential coil 23 is smaller than the distance between the dummy pattern 85 and the low-potential coil 22.

In that way, electric field concentration on the high-potential coil 23 can be suppressed properly. The smaller the distance between the dummy pattern 85 and the high-potential coil 23 with respect to the normal direction Z, the more effectively electric field concentration on the high-potential coil 23 can be suppressed. Preferably, the dummy pattern 85 is formed in the same interlayer insulation layer 57 as the high-potential coil 23. In that way, electric field concentration on the high-potential coil 23 can be suppressed more properly. The dummy pattern 85 includes a plurality of dummy patterns that are in varying electrical states. The dummy pattern 85 can include a high-potential dummy pattern.

The high-potential dummy pattern 86 can be formed at any depth in the insulation layer 51, which is adjusted according to the electric field strength to be attenuated. Preferably, the high-potential dummy pattern 86 is formed in a region closer to the high-potential coil 23 than to the low-potential coil 22 with respect to the normal direction Z. The high-potential dummy pattern 86 being closer to the high-potential coil 23 with respect to the normal direction Z means that, with respect to the normal direction Z, the distance between the high-potential dummy pattern 86 and the high-potential coil 23 is smaller than the distance between the high-potential dummy pattern 86 and the low-potential coil 22.

The dummy pattern 85 includes a floating dummy pattern that is formed in an electrically floating state in the insulation layer 51 so as to be located around the transformers 21A to 21D.

In the embodiment, the floating dummy pattern is patterned in dense lines so as to partly cover and partly expose a region around the high-potential coil 23 as seen in a plan view. The floating dummy pattern can be formed so as to have ends or no ends.

The floating dummy pattern can be formed at any depth in the insulation layer 51, which is adjusted according to the electric field strength to be attenuated.

Any number of floating lines can be provided, which is adjusted according to the electric field strength to be attenuated. The floating dummy pattern can include a plurality of floating dummy patterns.

Referring to FIG. 7, the semiconductor device 5 includes a second functional device 60 that is formed in the first principal surface 42 of the semiconductor chip 41 in a device region 62. The second functional device 60 is formed using a superficial part of the first principal surface 42 and/or a region on the first principal surface 42 of the semiconductor chip 41, and is covered by the insulation layer 51 (bottom insulation layer 55). In FIG. 7, the second functional device 60 is shown in a simplified form by broken lines indicated in a superficial part of the first principal surface 42.

The second functional device 60 is electrically connected to a low-potential terminal 11 via a low-potential wiring, and is electrically connected to a high-potential terminal 12 via a high-potential wiring. Except that the low-potential wiring is patterned in the insulation layer 51 so as to be connected to the second functional device 60, it has a similar structure to the first low-potential wiring 31 (second low-potential wiring 32). Except that the high-potential wiring is patterned in the insulation layer 51 so as to be connected to the second functional device 60, it has a similar structure to the first high-potential wiring 33 (second high-potential wiring 34). No description will be given of the low- and high-potential wirings associated with the second functional device 60.

The second functional device 60 can include at least one of a passive device, a semiconductor rectification device, and a semiconductor switching device. The second functional device 60 can include a circuit network comprising a selective combination of any two or more of a passive device, a semiconductor rectification device, and a semiconductor switching device. The circuit network can constitute part or the whole of an integrated circuit.

The passive device can include a semiconductor passive device. The passive device can include one or both of a resistor and a capacitor. The semiconductor rectification device can include at least one of a pn-junction diode, a PIN diode, a Zener diode, a Schottky barrier diode, and a fast-recovery diode. The semiconductor switching device can include at least one of a BJT (bipolar junction transistor), a MISFET (metal-insulator-semiconductor field-effect transistor), an IGBT (insulated-gate bipolar junction transistor), and a JFET (junction field-effect transistor).

Referring to FIGS. 5 to 7, the semiconductor device 5 further includes a sealing conductor 61 embedded in the insulation layer 51. The sealing conductor 61 is embedded in the form of walls in the insulation layer 51, at intervals from the insulation side walls 53A to 53D as seen in a plan view, and partitions the insulation layer 51 into the device region 62 and an outer region 63. The sealing conductor 61 prevents moisture entry and crack development from the outer region 63 to the device region 62.

The device region 62 is a region that includes the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. The outer region 63 is a region outside the device region 62.

The sealing conductor 61 is electrically isolated from the device region 62. Specifically, the sealing conductor 61 is electrically isolated from the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. More specifically, the sealing conductor 61 is held in an electrically floating state. The sealing conductor 61 does not form a current path connected to the device region 62.

The sealing conductor 61 is formed in the shape of a stripe along the insulation side walls 53A to 53D. In the embodiment, the sealing conductor 61 is formed in a quadrangular ring shape (specifically, a rectangular ring shape) as seen in a plan view. Thus, the sealing conductor 61 defines the outer region 63 in a quadrangular ring shape (specifically, a rectangular ring shape) surrounding the device region 62 as seen in a plan view.

Specifically, the sealing conductor 61 has a top end part at the insulation principal surface 52 side, a bottom end part at the semiconductor chip 41 side, and a wall part that extends in the form of walls between the top and bottom end parts. In the embodiment, the top end part of the sealing conductor 61 is formed at an interval from the insulation principal surface 52 toward the semiconductor chip 41, and is located in the insulation layer 51. In the embodiment, the top end part of the sealing conductor 61 is covered by the top insulation layer 56. The top end part of the sealing conductor 61 can be covered by one or a plurality of interlayer insulation layers 57. The top end part of the sealing conductor 61 can be exposed through the top insulation layer 56.

The bottom end part of the sealing conductor 61 is formed at an interval from the semiconductor chip 41 toward the top end part.

Thus, in the embodiment, the sealing conductor 61 is embedded in the insulation layer 51 so as to be located at the semiconductor chip 41 side of the plurality of low-potential terminals 11 and the plurality of high-potential terminals 12. Moreover, in the insulation layer 51, the sealing conductor 61 faces, in the direction parallel to the insulation principal surface 52, the first functional device 45 (plurality of transformers 21), the first low-potential wirings 31, the second low-potential wirings 32, the first high-potential wirings 33, the second high-potential wirings 34, and the dummy pattern 85. In the insulation layer 51, the sealing conductor 61 can face, in the direction parallel to the insulation principal surface 52, part of the second functional device 60.

The sealing conductor 61 includes a plurality of sealing plug conductors 64 and one or a plurality of (in the embodiment, a plurality of) sealing via conductors 65. Any number of sealing via conductors 65 may be provided. Of the plurality of sealing plug conductors 64, the top sealing plug conductor 64 constitutes the top end part of the sealing conductor 61. The plurality of sealing via conductors 65 constitute the bottom end part of the sealing conductor 61. Preferably, the sealing plug conductors 64 and the sealing via conductors 65 are formed of the same conductive material as the low-potential coil 22. That is, preferably, like the low-potential coil 22 and the like, the sealing plug conductors 64 and the sealing via conductors 65 each include a barrier layer and a body layer.

The plurality of sealing plug conductors 64 are embedded in the plurality of interlayer insulation layers 57 respectively, and are each formed in a quadrangular ring shape (specifically, a rectangular ring shape) surrounding the device region 62. The plurality of sealing plug conductors 64 are stacked together from the bottom insulation layer 55 to the top insulation layer 56 so as to be connected together. The number of layers stacked in the plurality of sealing plug conductors 64 is equal to the number of layers in the plurality of interlayer insulation layers 57. Needless to say, one or a plurality of sealing plug conductors 64 may be formed that penetrates a plurality of interlayer insulation layers 57.

So long as a set of a plurality of sealing plug conductor 64 constitutes one ring-shaped sealing conductor 61, not all the sealing plug conductors 64 need be formed in a ring shape. For example, at least one of the plurality of sealing plug conductors 64 can be formed so as to have ends. Or at least one of the plurality of sealing plug conductors 64 may be divided into a plurality of strip-shaped portions with ends. However, with consideration given to the risk of moisture entry and crack development into the device region 62, preferably, the plurality of sealing plug conductors 64 are formed so as to have no ends (in a ring shape).

The plurality of sealing via conductors 65 are formed in the bottom insulation layer 55, in a region between the semiconductor chip 41 and the sealing plug conductors 64. The plurality of sealing via conductors 65 are formed at an interval from the semiconductor chip 41, and are connected to the sealing plug conductors 64. The plurality of sealing via conductors 65 have a plane area smaller than the plane area of the sealing plug conductors 64. In a case where a single sealing via conductor 65 is formed, the single sealing via conductors 65 can have a plane area larger than the plane area of the sealing plug conductors 64.

The sealing conductor 61 can have a width of 0.1 μm or more but 10 μm or less. Preferably, the sealing conductor 61 has a width of 1 μm or more but 5 μm or less. The width of the sealing conductor 61 is defined by its width in the direction orthogonal to the direction in which it extends.

Figure 8:
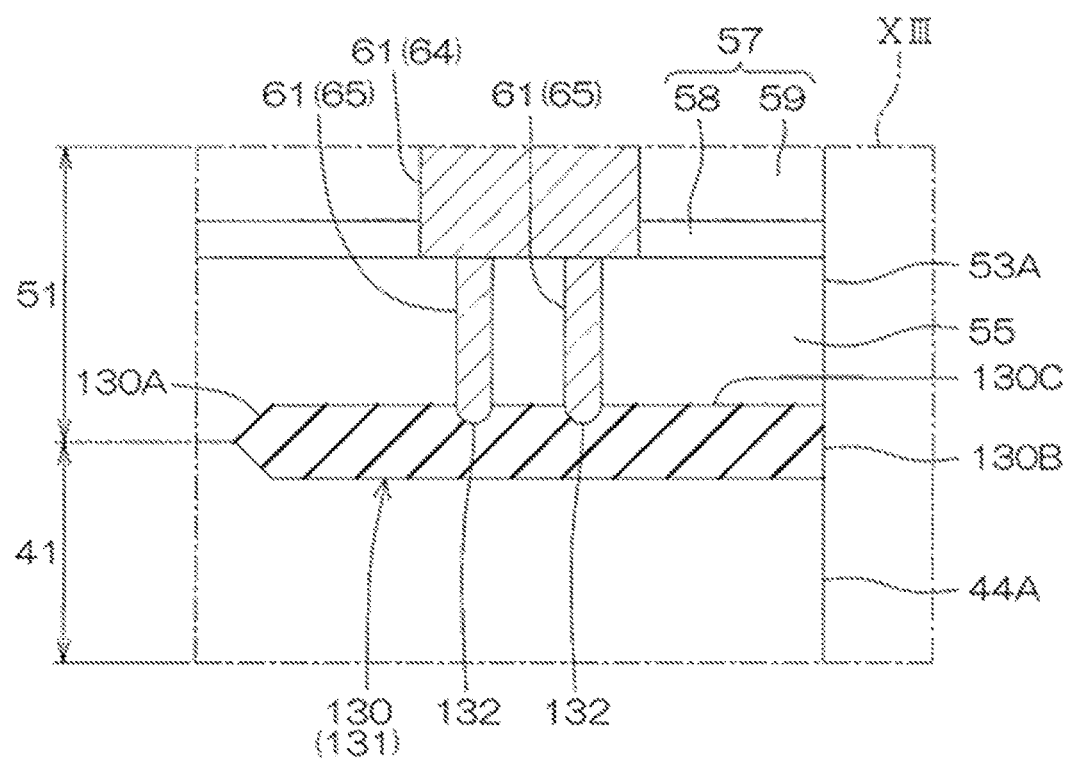
FIG. 8 is an enlarged view (showing a separation structure) of region XIII shown in FIG. 7.

Referring to FIGS. 7 and 8, the semiconductor device 5 further includes a separation structure 130 that is interposed between the semiconductor chip 41 and the sealing conductor 61 and that electrically isolates the sealing conductor 61 from the semiconductor chip 41. Preferably, the separation structure 130 includes an insulator. In the embodiment, the separation structure 130 is a field insulation film 131 formed on the first principal surface 42 of the semiconductor chip 41.

The field insulation film 131 includes at least one of an oxide film (silicon oxide film) and a nitride film (silicon nitride film). Preferably, the field insulation film 131 is a LOCOS (local oxidation of silicon) film as one example of an oxide film that is formed through oxidation of the first principal surface 42 of the semiconductor chip 41. The field insulation film 131 can have any thickness so long as it can insulate between the semiconductor chip 41 and the sealing conductor 61. The field insulation film 131 can have a thickness of 0.1 μm or more but 5 μm or less.

The separation structure 130 is formed on the first principal surface 42 of the semiconductor chip 41, and extends in the shape of a stripe along the sealing conductor 61 as seen in a plan view. In the embodiment, the separation structure 130 is formed in a quadrangular ring shape (specifically, a rectangular ring shape) as seen in a plan view. The separation structure 130 has a connection portion 132 to which the bottom end part of the sealing conductor 61 (i.e., the sealing via conductors 65) is connected. The connection portion 132 can form an anchor portion into which the bottom end part of the sealing conductor 61 (i.e., the sealing via conductors 65) is anchored toward the semiconductor chip 41. Needless to say, the connection portion 132 can be formed to be flush with the principal surface of the separation structure 130.

The separation structure 130 includes an inner end part 130A at the device region 62 side, an outer end part 130B at the outer region 63 side, and a main body part 130C between the inner and outer end parts 130A and 130B. As seen in a plan view, the inner end part 130A defines the region where the second functional device 60 is formed (i.e., the device region 62). The inner end part 130A can be formed integrally with an insulation film (not illustrated) formed on the first principal surface 42 of the semiconductor chip 41.

The outer end part 130B is exposed on the chip side walls 44A to 44D of the semiconductor chip 41, and is continuous with the chip side walls 44A to 44D of the semiconductor chip 41. More specifically, the outer end part 130B is formed so as to be flush with the chip side walls 44A to 44D of the semiconductor chip 41. The outer end part 130B constitutes a polished surface between, to be flush with, the chip side walls 44A to 44D of the semiconductor chip 41 and the insulation side walls 53A to 53D of the insulation layer 51. Needless to say, an embodiment is also possible where the outer end part 130B is formed within the first principal surface 42 at intervals from the chip side walls 44A to 44D.

The main body part 130C has a flat surface that extends substantially parallel to the first principal surface 42 of the semiconductor chip 41. The main body part 130C has the connection portion 132 to which the bottom end part of the sealing conductor 61 (i.e., the sealing via conductors 65) is connected. The connection portion 132 is formed in the main body part 130C, at intervals from the inner and outer end parts 130A and 130B. The separation structure 130 can be implemented in many ways other than in the form of a field insulation film 131.

Referring to FIG. 7, the semiconductor device 5 further includes an inorganic insulation layer 140 formed on the insulation principal surface 52 of the insulation layer 51 so as to cover the sealing conductor 61. The inorganic insulation layer 140 can be called a passivation layer. The inorganic insulation layer 140 protects the insulation layer 51 and the semiconductor chip 41 from above the insulation principal surface 52.

In the embodiment, the inorganic insulation layer 140 has a stacked structure composed of a first inorganic insulation layer 141 and a second inorganic insulation layer 142. The first inorganic insulation layer 141 can contain silicon oxide. Preferably, the first inorganic insulation layer 141 contains USG (undoped silicate glass), which is undoped silicon oxide. The first inorganic insulation layer 141 can have a thickness of 50 nm or more but 5000 nm or less. The second inorganic insulation layer 142 can contain silicon nitride. The second inorganic insulation layer 142 can have a thickness of 500 nm or more but 5000 nm or less. Increasing the total thickness of the inorganic insulation layer 140 helps increase the dielectric strength voltage above the high-potential coils 23.

In a configuration where the first inorganic insulation layer 141 is made of USG and the second inorganic insulation layer 142 is made of silicon nitride, USG has the higher dielectric breakdown voltage (V/cm) than silicon nitride. In view of this, when thickening the inorganic insulation layer 140, it is preferable to form the first inorganic insulation layer 141 thicker than the second inorganic insulation layer 142.

The first inorganic insulation layer 141 can contain at least one of BPSG (boron-doped phosphor silicate glass) and PSG (phosphorus silicate glass) as examples of silicon oxide. In that case, however, since the silicon oxide contains a dopant (boron or phosphorus), for an increased dielectric strength voltage above the high-potential coils 23, it is particularly preferable to form the first inorganic insulation layer 141 of USG. Needless to say, the inorganic insulation layer 140 can have a single-layer structure composed of either the first or second inorganic insulation layer 141 or 142.

The inorganic insulation layer 140 covers the entire area of the sealing conductor 61, and has a plurality of low-potential pad openings 143 and a plurality of high-potential pad openings 144 that are formed in a region outside the sealing conductor 61. The plurality of low-potential pad openings 143 expose the plurality of low-potential terminals 11 respectively. The plurality of high-potential pad openings 144 expose the plurality of high-potential terminals 12 respectively. The inorganic insulation layer 140 can have overlap parts that overlap circumferential edge parts of the low-potential terminals 11. The inorganic insulation layer 140 can have overlap parts that overlap circumferential edge parts of the high-potential terminals 12.

The semiconductor device 5 further includes an organic insulation layer 145 that is formed on the inorganic insulation layer 140. The organic insulation layer 145 can contain photosensitive resin. The organic insulation layer 145 can contain at least one of polyimide, polyamide, and polybenzoxazole. In the embodiment, the organic insulation layer 145 contains polyimide. The organic insulation layer 145 can have a thickness of 1 µm or more but 50 µm or less.

Preferably, the organic insulation layer 145 has a thickness larger than the total thickness of the inorganic insulation layer 140. Moreover, preferably, the inorganic and organic insulation layers 140 and 145 together have a total thickness larger than the distance D2 between the low- and high-potential coils 22 and 23. In that case, preferably, the inorganic insulation layer 140 has a total thickness of 2 µm or more but 10 µm or less. Preferably, the organic insulation layer 145 has a thickness of 5 µm or more but 50 µm or less. Such structures help suppress an increase in the thicknesses of the inorganic and organic insulation layers 140 and 145 while appropriately increasing the dielectric strength voltage above the high-potential coil 23 owing to the stacked film of the inorganic and organic insulation layers 140 and 145.

The organic insulation layer 145 includes a first part 146 that covers a low-potential side region and a second part 147 that covers a high-potential side region. The first part 146 covers the sealing conductor 61 across the inorganic insulation layer 140. The first part 146 has a plurality of low-potential terminal openings 148 through which the plurality of low-potential terminals 11 (low-potential pad openings 143) are respectively exposed in a region outside the sealing conductor 61. The first part 146 can have overlapping parts that overlap circumferential edges (overlap parts) of the low-potential pad openings 143.

The second part 147 is formed at an interval from the first part 146, and exposes the inorganic insulation layer 140 between the first and second parts 146 and 147. The second part 147 has a plurality of high-potential terminal openings 149 through which the plurality of high-potential terminals 12 (high-potential pad openings 144) are respectively exposed. The second part 147 can have overlap parts that overlap circumferential edges (overlap parts) of the high-potential pad openings 144.

The second part 147 covers the transformers 21A to 21D and the dummy pattern 85 together. Specifically, the second part 147 covers the plurality of high-potential coils 23, the plurality of high-potential terminals 12, a first high-potential dummy pattern 87, a second high-potential dummy pattern 88, and a floating dummy pattern 121 together.

The present invention can be implemented in any other embodiments. The embodiment described above deals with an example where a first functional device 45 and a second functional device 60 are formed. An embodiment is however also possible that only has a second functional device 60, with no first functional device 45. In that case, the dummy pattern 85 may be omitted. This structure provides, with respect to the second functional device 60, effects similar to those mentioned in connection with the first embodiment (except those associated with the dummy pattern 85).

That is, in a case where a voltage is applied to the second functional device 60 via the low- and high-potential terminals 11 and 12, it is possible suppress unnecessary conduction between the high-potential terminal 12 and the sealing conductor 61. Likewise, in a case where a voltage is applied to the second functional device 60 via the low- and high-potential terminals 11 and 12, it is possible suppress unnecessary conduction between the low-potential terminal 11 and the sealing conductor 61.

The embodiment described above deals with an example where a second functional device 60 is formed. The second functional device 60 however is not essential, and can be omitted.

The embodiment described above deals with an example where a dummy pattern 85 is formed. The dummy pattern 85 however is not essential, and can be omitted.

The embodiment described above deals with an example where the first functional device 45 is of a multichannel type that includes a plurality of transformers 21. It is however also possible to employ a single-channel first functional device 45 that includes a single transformer 21.

<Transformer Layout>

Figure 9:
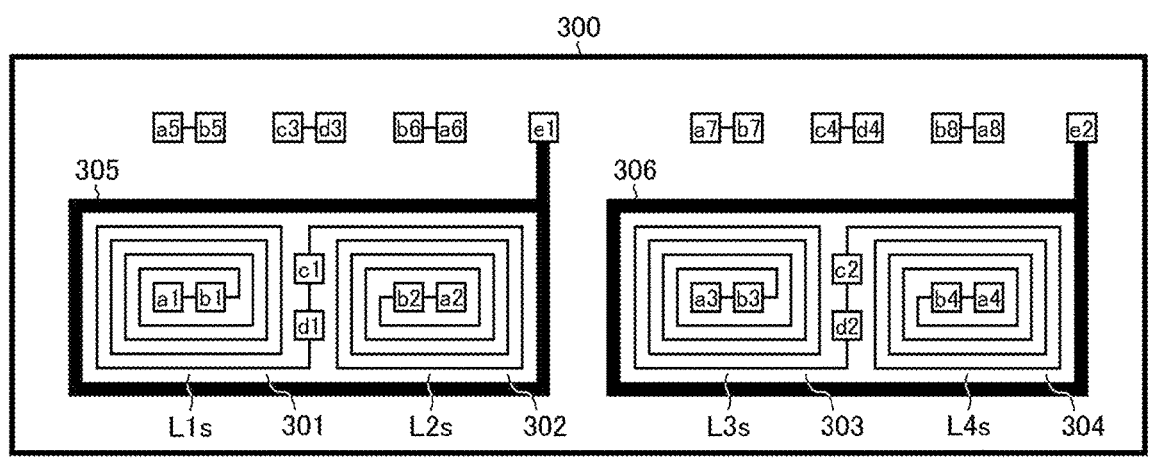
FIG. 9 is a diagram schematically showing an example of the layout of a transformer chip.

FIG. 9 is a plan view (top view) schematically showing one example of transformer layout in a two-channel transformer chip 300 (corresponding to the semiconductor device 5 described previously). The transformer chip 300 shown there includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to one terminal of the secondary coil L1s of the first transformer 301, and the pads c1 and d1 are connected to the other terminal of that secondary coil L1s. The pads a2 and b2 are connected to one terminal of the secondary coil L2s of the second transformer 302, and the pads c1 and d1 are connected to the other terminal of that secondary coil L2s.

Moreover, the pads a3 and b3 are connected to one terminal of the secondary coil L3s of the third transformer 303, and the pads c2 and d2 are connected to the other terminal of that secondary coil L3s. The pads a4 and b4 are connected to one terminal of the secondary coil L4s of the fourth transformer 304, and the pads c2 and d2 are connected to the other terminal of that secondary coil L4s.

FIG. 9 does not show any of the primary coils of the first, second, third, and fourth transformers 301, 302, 303, and 304. The primary coils basically have structures similar to those of the secondary coils L1s to L4s respectively, and are disposed right below the secondary coils L1s to L4s, respectively, so as to face them.

Specifically, the pads a5 and b5 are connected to one terminal of the primary coil of the first transformer 301, and the pads c3 and d3 are connected to the other terminal of that primary coil. Likewise, the pads a6 and b6 are connected to one terminal of the primary coil of the second transformer 302, and the pads c3 and d3 are connected to the other terminal of that primary coil.

Likewise, the pads a7 and b7 are connected to one terminal of the primary coil of the third transformer 303, and the pads c4 and d4 are connected to the other terminal of that primary coil. Likewise, the pads a8 and b8 are connected to one terminal of the primary coil of the fourth transformer 304, and the pads c4 and d4 are connected to the other terminal of that primary coil.

The pads a5 to a8, the pads b5 to b8, the pads c3 and c4, and the pads d3 and d4 mentioned above are each led from inside the transformer chip 300 to its surface across an unillustrated via.

Of the plurality of pads mentioned above, the pads a1 to a8 each correspond to a first current feed pad, and the pads b1 to b8 each correspond to a first voltage measurement pad; the pads c1 to c4 each correspond to a second current feed pad, and the pads d1 to d4 each correspond to a second voltage measurement pad.

Thus, the transformer chip 300 of this configuration example permits, during its defect inspection, accurate measurement of the series resistance component across each coil. It is thus possible not only to reject defective products with a broken wire in a coil but also to appropriately reject defective products with an abnormal resistance value in a coil (e.g., a midway short circuit between coils), and hence to prevent defective products from being distributed in the market.

For a transformer chip 300 that has passed the defect inspection mentioned above, the plurality of pads described above can be used for connection with a primary-side chip and a secondary-side chip (e.g., the controller chip 210 and the driver chip 220 described previously).

Specifically, the pads a1 and b1, the pads a2 and b2, the pads a3 and b3, and the pads a4 and b4 can each be connected to one of the signal input and output terminals of the secondary-side chip; the pads c1 and d1 and the pads c2 and d2 can each be connected to a common voltage application terminal (GND2) of the secondary-side chip.

On the other hand, the pads a5 and b5, the pads a6 and b6, the pads a7 and b7, and the pads a8 and b8 can each be connected to one of the signal input and output terminals of the primary-side chip; the pads c3 and d3 and the pads c4 and d4 can each be connected to a common voltage application terminal (GND1) of the primary-side chip.

Here, as shown in FIG. 9, the first to fourth transformers 301 to 304 are so arranged as to be coupled for each signal transmission direction. In terms of what is shown in the diagram, for example, the first and second transformers 301 and 302, which transmit a signal from the primary-side chip to the secondary-side chip, are coupled into a first pair by the first guard ring 305. Likewise, for example, the third and fourth transformers 303 and 302, which transmit a signal from the secondary-side chip to the primary-side chip, are coupled into a second pair by the second guard ring 306.

Such coupling is intended, in a structure where the primary and secondary coils of each of the first to fourth transformers 301 to 304 are formed so as to be stacked on each other in the up-down direction of the substrate, to obtain a desired withstand voltage between the primary and secondary coils. The first and second guard rings 305 and 306 are however not essential elements.

The first and second guard rings 305 and 306 can be connected via pads e1 and e2, respectively, to a low-impedance wiring such as a grounded terminal.

In the transformer chip 300, the pads c1 and d1 are shared between the secondary coils L1s and L2s. The pads c2 and d2 are shared between the secondary coils L3s and L4s. The pads c3 and d3 are shared between the primary coils L1p and L2p. The pads c4 and d4 are shared between the primary coils that correspond to them respectively. This configuration helps reduce the number of pads and helps make the transformer chip 300 compact.

Moreover, as shown in FIG. 9, the primary and secondary coils of the first to fourth transformers 301 to 304 are preferably each wound in a rectangular shape (or, with the corners rounded, in a running-track shape) as seen in a plan view of the transformer chip 300. This configuration helps increase the area over which the primary and secondary coils overlap each other and helps enhance the transmission efficiency across the transformers.

Needless to say, the illustrated transformer layout is merely an example; any number of coils of any shape can be disposed in any layout, and pads can be disposed in any layout. Any of the chip structure, transformer layouts, etc. described above can be applied to semiconductor devices in general that have a coil integrated in a semiconductor chip.

<Signal Transmission Device (Embodiment)>

Figure 10:
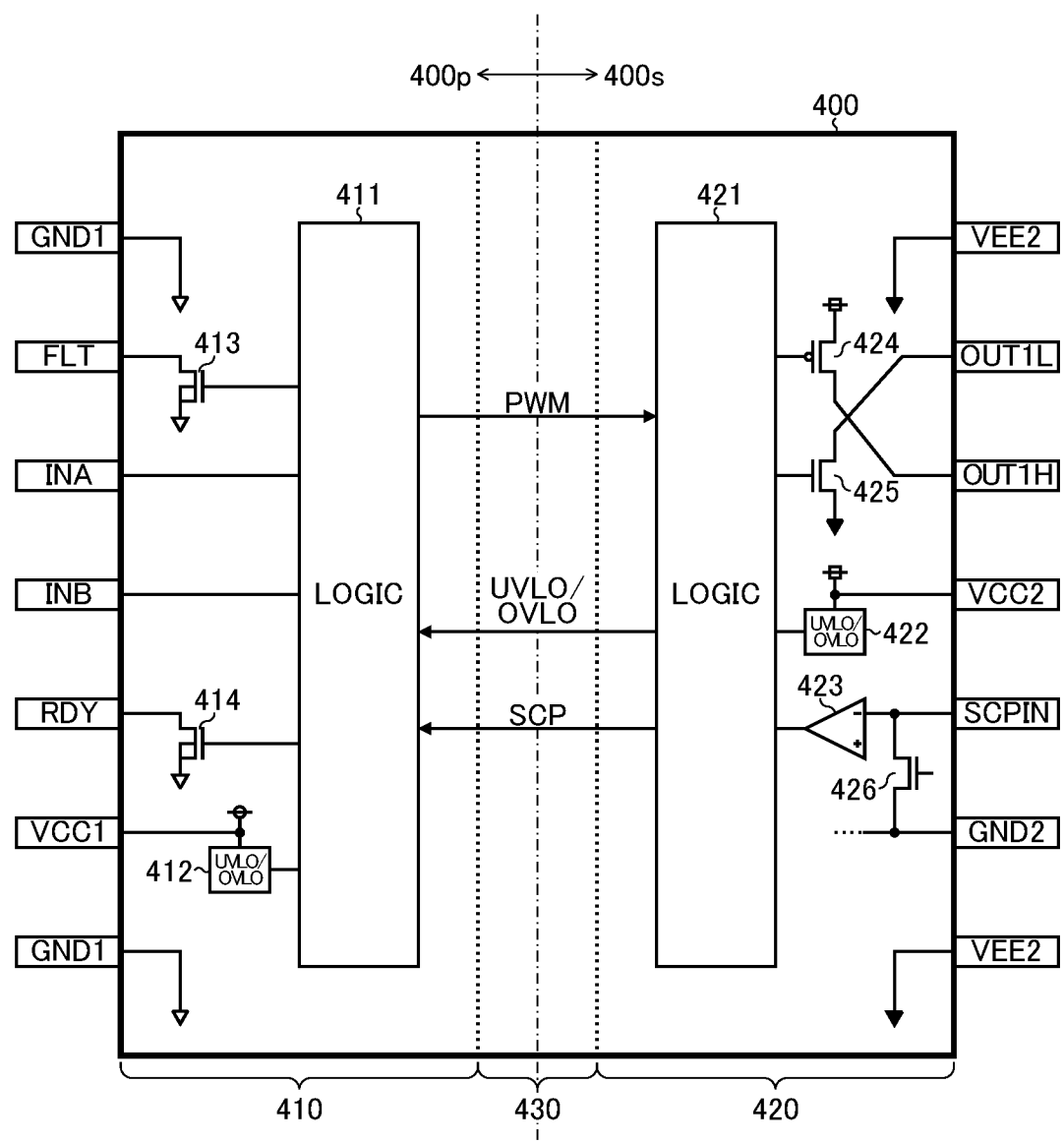
FIG. 10 is a diagram showing a signal transmission device according to an embodiment.

FIG. 10 is a diagram showing a signal transmission device according to an embodiment. The signal transmission device 400 of this embodiment is a semiconductor integrated circuit device (what is generally called an isolated gate driver IC) that, while isolating between a primary circuit system 400p (VCC1-GND1 system) and a secondary circuit system 400s (VCC2-GND2 system), transmits a pulse signal from the primary circuit system 400p to the secondary circuit system 400s to drive the gate of a power transistor (unillustrated)

provided in the secondary circuit system 400s. The signal transmission device 400 can be understood as corresponding to the signal transmission device 200 described previously.

The signal transmission device 400 has, as a means for establishing electrical connection with outside it, a plurality of external terminals (of which the diagram shows power terminals VCC1 and VCC2, ground terminals GND1 and GND2, a negative power terminal VEE2, input terminals INA and INB, output terminals OUT1H and OUT1L, a fault terminal FLT, a ready terminal RDY, and a short detection terminal SCPIN).

Along a first side (the left side in the diagram) of the package of the signal transmission device 400 are disposed, from top down, the ground terminal GND1, the fault terminal FLT, the input terminal INA, the input terminal INB, the ready terminal RDY, the power terminal VCC1, and the ground terminal GND1. Along a second side (the side opposite from the first side mentioned above, i.e., the right side in the diagram) of the package are disposed, from top down, the negative power terminal VEE2, the output terminal OUT1L, the output terminal OUT1H, the power terminal VCC2, the short detection terminal SCPIN, the ground terminal GND2, and the negative power terminal VEE2.

In this way, the external terminals for the primary circuit system 400p (i.e., GND1, FLT, INA and INB, RDY, and VCC1) can be arranged together along the first side of the package, and the external terminals for the secondary circuit system 400s (i.e., VEE2, OUT1L, OUT1H, VCC2, SCPIN, and GND2) can be arranged together along the second side of the package.

The ground terminal GND1 and the negative power terminal VEE2 can each be disposed at either end of the corresponding one of the first or second sides of the package. That is, two each of the ground terminals GND1 and the negative power terminals VEE2 can be provided.

The signal transmission device 400 can be employed widely in applications in general that require signal transmission between a primary circuit system 400p and a secondary circuit system 400s while isolating between them (such as motor drivers and DC/DC converters that handle high voltages).

Referring still to FIG. 10, the internal configuration of the signal transmission device 400 will be described. The signal transmission device 400 of this configuration example has a controller chip 410 (corresponding to a first chip), a driver chip 420 (corresponding to a second chip), and a transformer chip 430 (corresponding to a third chip) sealed in a single package.

The controller chip 410 is a semiconductor chip having integrated on it the circuit elements of the primary circuit system 400p that operate by being supplied with a supply voltage VCC1 (e.g., seven volts at the maximum with respect to GND1). The controller chip 410 has integrated on it, for example, a logic circuit 411, an UVLO (undervoltage lock-out)/OVLO (overvoltage lock-out) circuit 412, and NMOSFETs 413 and 414.

The logic circuit 411 generates a driving pulse signal PWM for a power transistor (unillustrated) according to input pulse signals INA and INB. For example, when INB=H (the logic level indicating a disabled state), PWM=L (fixed value); when INB=L (the logic level indicating an enabled state), PWM=INA. The logic circuit 411 also monitors various fault detection signals (such as undervoltage, overvoltage, short-circuit, open-circuit, overheat, and load power faults) and drives the NMOSFETs 413 and 414 according to the results of the monitoring to determine the logic levels of the fault signal FLT and the ready signal RDY.

The UVLO/OVLO circuit 412 detects an undervoltage/overvoltage in the supply voltage VCC1, and outputs the result of the detection to the logic circuit 411.

The NMOSFET 413 switches the path between the fault terminal FLT and a ground terminal between a conducting state and a cut-off state according to instructions from the logic circuit 411. For example, when an overheat or load power fault is detected in the driver chip 420, the NMOSFET 413 turns on and thus the fault terminal FLT turns to low level (the logic level indicating a fault being detected).

The NMOSFET 414 switches the path between the ready terminal RDY and the ground terminal between a conducting state and a cut-off state according to instructions from the logic circuit 411. For example, when an overheat or load power fault is detected in either the controller chip 410 or the driver chip 420, the NMOSFET 414 turns on and thus the ready terminal RDY turns to low level (the logic level indicating a fault being detected).

The driver chip 420 is a semiconductor chip having integrated on it the circuit elements of the secondary circuit system 400s that operate by being supplied with a supply voltage VCC2 (e.g., 30 volts at the maximum with respect to GND2. The driver chip 420 has integrated on it, for example, a logic circuit 421, an UVLO (undervoltage lock-out)/OVLO (overvoltage lock-out) circuit 422, a comparator 423, a PMOSFET 424, and NMOSFETs 425 and 426.

The logic circuit 421 turns on and off the PMOSFET 424 and the NMOSFET 425 according to the driving pulse signal PWM fed to the logic circuit 421 via the transformer chip 430, and thereby drives the gate of the power transistor (unillustrated) connected to the output terminals OUT1H and OUT1L. The output terminals OUT1H and OUT1L can be short-circuited to each other outside the signal transmission device 400. The logic circuit 421 also has a function of transmitting various fault detection signals (such as undervoltage, overvoltage, short-circuit, open-circuit, overheat, and load power faults) from the driver chip 420 to the controller chip 410 via the transformer chip 430.

The UVLO/OVLO circuit 422 detects an undervoltage/overvoltage in the supply voltage VCC2, and outputs the result of the detection to the logic circuit 421.

The comparator 423 monitors the terminal voltage at the short detection terminal SCPIN, and thereby checks for a short circuit in the power transistor (details will be given later).

The PMOSFET 424 is one gate driving transistor, and switches the path between a power terminal and the output terminal OUT1H between a conducting state and a cut-off state according to instructions from the logic circuit 421. For example, when the driving pulse signal PWM is at high level, the PMOSFET 424 is on, and thus the output terminal OUT1H (hence the output pulse signal applied to the gate of the power transistor) is at high level.

The PMOSFET 425 is another gate driving transistor, and switches the path between the output terminal OUT1L and a ground terminal between a conducting state and a cut-off state according to instructions from the logic circuit 421. For example, when the driving pulse signal PWM is at low level, the PMOSFET 425 is on, and thus the output terminal OUT1L (hence the output pulse signal applied to the gate of the power transistor) is at low level.

Thus, the PMOSFET 424 and the NMOSFET 425 function as a half-bridge output stage (CMOS [complementary MOS] inverter stage) for gate driving.

The NMOSFET 426 switches the path between the ground terminal GND2 and the short detection terminal SCPIN between a conducting state and a cut-off state according to instructions from the logic circuit 421. For example, when OUT1H=H, the NMOSFET 426 is off and, when OUT1H=L, the NMOSFET 426 is on. The NMOSFET 426 turns on and off complementarily with the PMOSFET 424 (hence the unillustrated power transistor), and thereby functions as a discharge switch for discharging a capacitor (unillustrated) externally connected between SCPIN and GND2 (details will be given later).

The transformer chip 430 is a semiconductor chip having integrated on it a transformer for signal transmission between the controller chip 410 and the driver chip 420 while isolating between them.

The signal transmission device 400 according to the embodiment has, separately from the controller chip 410 and the driver chip 420, the transformer chip 430 that incorporates a transformer alone, and these three chips are sealed in a single package.

With this configuration, the controller chip 410 and the driver chip 420 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

Moreover, the controller chip 410 and the driver chip 420 can each be fabricated by a time-proven existing process. This eliminates the need for conducting reliability tests anew, and contributes to a shortened development period and reduced development costs.

Moreover, use of a DC isolating element other than a transformer (e.g., a photocoupler) can be coped with easily by solely mounting the alternative in place of the transformer chip 430. This eliminates the need for re-developing the controller chip 410 and the driver chip 420, and contributes to a shortened development period and reduced development costs.

<Electronic Device>

Figure 11:
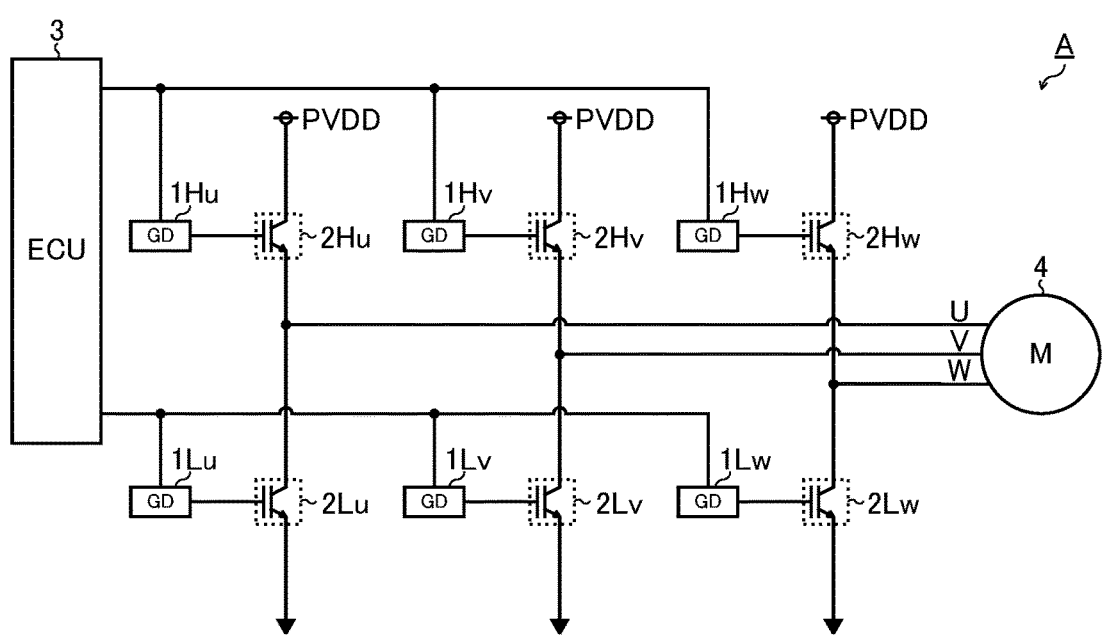
FIG. 11 is a diagram showing one configuration example of an electronic device that incorporates a signal transmission device.

FIG. 11 is a diagram showing one configuration example of an electronic device that incorporates the signal transmission device 400. The electronic device A of this configuration example includes high-side gate driver ICs 1H(u/v/w), low-side gate driver ICs 1L(u/v/w), high-side power transistors 2H(u/v/w), low-side power transistors 2L(u/v/w), an ECU 3, and a motor 4.

The high-side gate driver ICs 1H(u/v/w), while isolating between the ECU 3 and the high-side power transistors 2H(u/v/w) respectively, generate high-side gate drive signals according to the high-side gate signals fed from the ECU 3, and thereby drive the high-side power transistors 2H(u/v/w).

The low-side gate driver ICs 1L(u/v/w), while isolating between the ECU 3 and the low-side power transistors 2L(u/v/w) respectively, generate low-side gate drive signals according to the low-side gate signals fed from the ECU 3, and thereby drive the low-side power transistors 2L(u/v/w).

As each of the high- and low-side gate driver ICs 1H(u/v/w) and 1L(u/v/w) mentioned above, the signal transmission device 400 described previously can be suitably used.

The high-side power transistors 2H(u/v/w) are each connected, as a high-side switch in a half-bridge output stage for one of three phases (U/V/W phases) respectively, between a power-system power terminal (i.e., an application terminal for a load supply voltage PVDD) and the input terminal of the motor 4 for the corresponding phase.

The low-side power transistors 2L(u/v/w) are each connected, as a low-side switch in a half-bridge output stage for one of three phases (U phase/V phase/W phase) respectively, between the input terminal of the motor 4 for the corresponding phase and a power-system ground terminal.

In the diagram, the high- and low-side power transistors 2H(u/v/w) and 2L(u/v/w) are implemented as IGBTs (insulated-gate bipolar transistors) respectively. Instead of IGBTs, MOSFETs (metal-oxide-semiconductor field-effect transistors) may be used.

The ECU 3 drives the high- and low-side power transistors 2H(u/v/w) and 2L(u/v/w) via the high- and low-side gate driver ICs 1H(u/v/w) and 1L(u/v/w) respectively, and thereby controls the driving of the rotation of the motor 4. The ECU 3 also has a function of monitoring the fault terminal FLT and the ready terminal RDY of each of the high- and low-side gate driver ICs 1H(u/v/w) and 1L(u/v/w) and performing various kinds of safety control based on the results of the monitoring.

The motor 4 is a three-phase motor that is driven to rotate according to three-phase driving voltages U/V/W fed from the half-bridge output stages for three phases (U/V/W phases) respectively.

<Short-Circuit (Through-Current) Detection>

Figure 12:
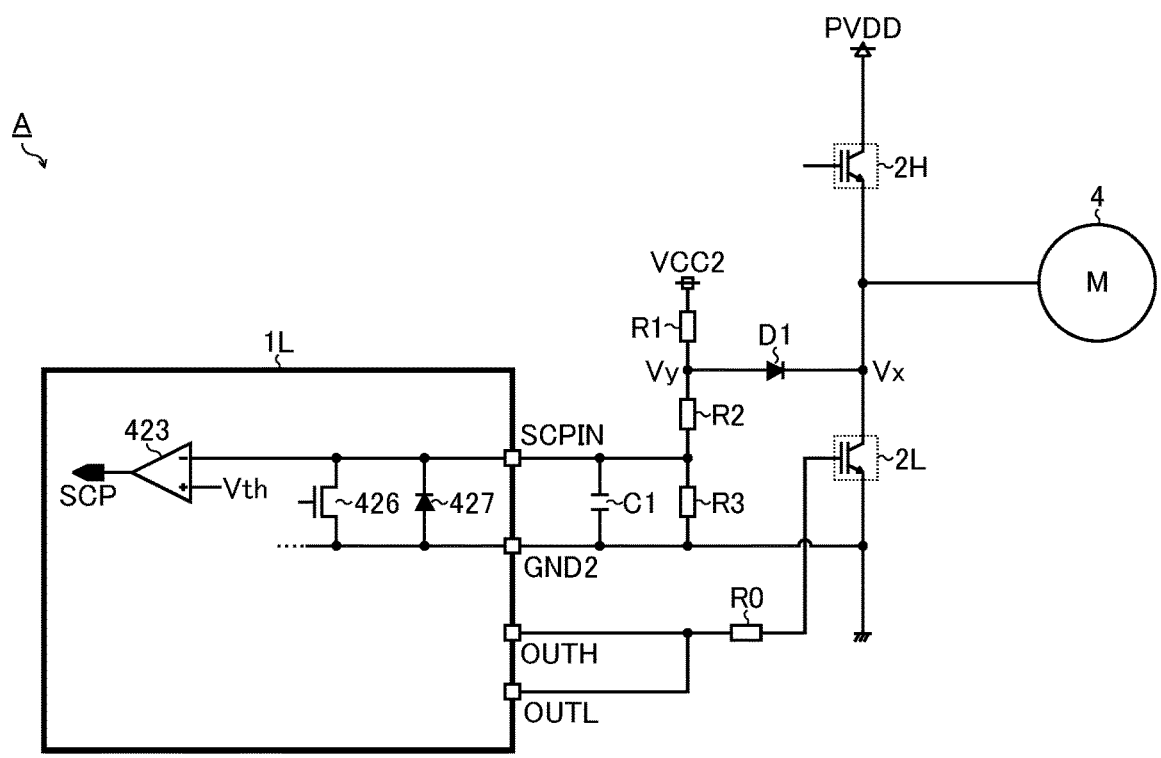
FIG. 12 is a diagram showing a first example of connection (a DESAT scheme) of a short detection terminal.

FIG. 12 is a diagram showing a first example of connection (a DESAT scheme) of the short detection terminal SCPIN, showing, for convenience' sake, only the part of the electronic device A corresponding to one phase alone.

As shown there, externally connected to, from outside, the low-side gate driver IC 1L (signal transmission device 400) designed for short-circuit detection with a DESAT scheme are a diode D1, resistors R0 to R3, and a capacitor C1. The first terminal of the resistor R0 connected to both the output terminals OUT1H and OUT1L. The second terminal of the resistor R0 is connected to the gate of the low-side power transistor 2L. The first terminal of the resistor R1 is connected to an application terminal for the power terminal VCC2. The second terminal of the resistor R1 and the first terminal of the resistor R2 are both connected to the anode of the diode D1. The cathode of the diode D1 connected to the connection node between the emitter of the high-side power transistor 2H and the collector of the low-side power transistor 2L. The second terminal of the resistor R2 and the first terminals of the resistor R3 and the capacitor C1 are all connected to the short detection terminal SCPIN. The second terminals of the resistor R3 and the capacitor C1 are both connected to ground terminal GND2.

Inside the low-side gate driver IC 1L, the comparator 423, the NMOSFET 426, and a diode 427 are connected to the short detection terminal SCPIN.

The comparator 423 generates a short detection signal SCP by comparing a short detection voltage SCPIN (the terminal voltage at the short detection terminal SCP), which is fed to the inverting input terminal (−) of the comparator 423, with a predetermined threshold voltage Vth. The short detection signal SCP is at high level (the logic level indicating normal condition) when SCPIN<Vth, and is at low level (the logic level indicating faulty condition) when SCPIN>Vth.

The NMOSFET 426 turns on and off complementarily with the low-side power transistor 2L and the PMOSFET 424 to switch the path between the ground terminal GND2 and the short detection terminal SCPIN between a conducting state and a cut-off state, and thereby functions as a discharge switch for discharging the capacitor C1 externally connected between SCPIN and GND2. For example, the NMOSFET 426 is off during the on period of the low-side power transistor 2L and the PMOSFET 424, and is on during the off period of the low-side power transistor 2L and the PMOSFET 424.

The diode 427 is an electrostatic protection diode of which the anode is connected to the ground terminal GND2 and of which the cathode is connected to the short detection terminal SCPIN.

In normal condition (a condition where the high-side power transistor 2H is off and the low-side power transistor 2L is on), the cathode voltage Vx of the diode D1 remains approximately as low as the ground terminal GND2. Thus, the diode D1 is forward-biased, and the anode voltage Vy of the diode D1 is approximately equal to its forward drop voltage Vf. In this state, the short detection voltage SCPIN (=[R3/(R2+R3)]×VCC2]) is lower than the threshold voltage Vth, and thus the short detection signal SCP is at high level (the logic level indicating normal condition).

By contrast, in short-circuited condition (a condition where the high- and low-side power transistors 2H and 2L are simultaneously on and an excessively high short-circuit current may pass), the cathode voltage Vx of the diode D1 is approximately as high as the load supply voltage PVDD. Thus, the diode D1 is reverse-biased, and the anode voltage Vy of the diode D1 is approximately equal to the supply voltage VCC2. In this state, the short detection voltage SCPIN (=[R3/(R2+R3)]×VCC2]) is higher than the threshold voltage Vth, and thus the short detection signal SCP is at low level (the logic level indicating faulty condition).

In this way, with a DESAT scheme, it is possible, by monitoring the short detection voltage SCPIN, to check whether the low-side power transistor 2L is unsaturated between its collector and emitter, that is, whether the high- and low-side power transistors 2H and 2L are in a short-circuited (simultaneously-on) state.

The logic circuit 421 is provided with a protection function whereby, when the short detection signal SCP mentioned above turns to low level (the logic level indicating faulty condition), the low-side power transistor 2L is forcibly turned off. After the low-side power transistor 2L is forcibly turned off, the logic circuit 421 can also turn on the NMOSFET 426 and discharge the capacitor C1 so as to thereby cancel the short circuit-detected state.

Figure 13:
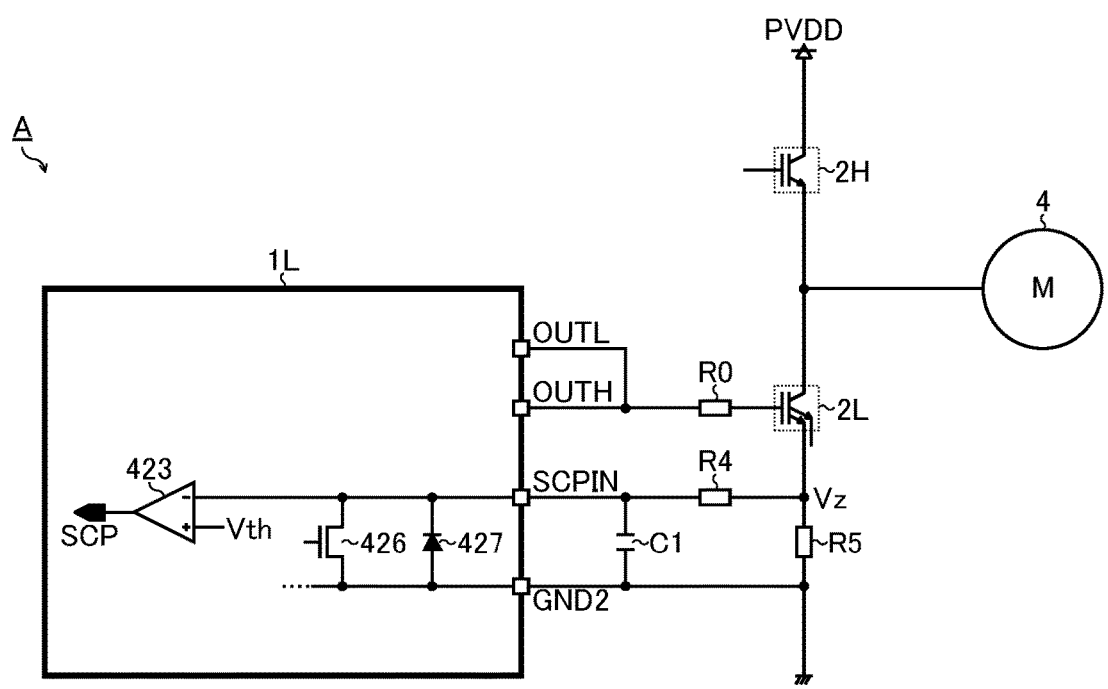
FIG. 13 is a diagram showing a second example of connection (an emitter-sense scheme) of a short detection terminal.

FIG. 13 is a diagram showing a second example of connection (an emitter-sense scheme) of the short detection terminal SCPIN, showing, like FIG. 12 referred to previously, only the part of the electronic device A corresponding to one phase alone.

As shown there, externally connected to, from outside, the low-side gate driver IC 1L (signal transmission device 400) designed for short-circuit detection with an emitter-sense scheme are a resistor R0, resistors R4 and R5, and a capacitor C1. The first terminal of the resistor R0 is connected to both the output terminals OUT1H and OUT1L. The second terminal of the resistor R0 is connected to the gate of the low-side power transistor 2L. The first terminals of the resistor R4 and the capacitor C1 are both connected to the short detection terminal SCPIN. The second terminal of the resistor R4 and the first terminal of the resistor R5 are both connected to the emitter (sensing emitter) of the low-side power transistor 2L. The second terminals of the resistor R5 and the capacitor C1 are both connected to the ground terminal GND2.

In normal condition (a condition where the high-side power transistor 2H is off and the low-side power transistor 2L is on), no excessively high short-circuit current passes through the resistor R5, and thus the terminal-to-terminal voltage Vz across the resistor R2 remains approximately as low as the ground voltage GND2. In this state, the short detection voltage SCPIN (≈Vz) is lower than the threshold voltage Vth, and thus the short detection signal SCP is at high level (the logic level indicating normal condition).

By contrast, in short-circuited condition (a condition where the high- and low-side power transistors 2H and 2L are simultaneously on and an excessively high short-circuit current may pass), the terminal-to-terminal voltage Vz across the resistor R5 rises up to a voltage value (=Isc×R5) commensurate with the short-circuit current Isc. In this state, the short detection voltage SCPIN (≈Vz) is higher than the threshold voltage Vth, and thus the short detection signal SCP is at low level (the logic level indicating faulty condition).

In this way, with an emitter-sense scheme, it is possible, by monitoring the short detection voltage SCPIN, to check whether an excessively high short-circuit current Isc is passing through the low-side power transistor 2L, that is, whether the high- and low-side power transistors 2H and 2L are in a short-circuited (simultaneously-on) state.

<Open Detection Circuit>

Figure 14:
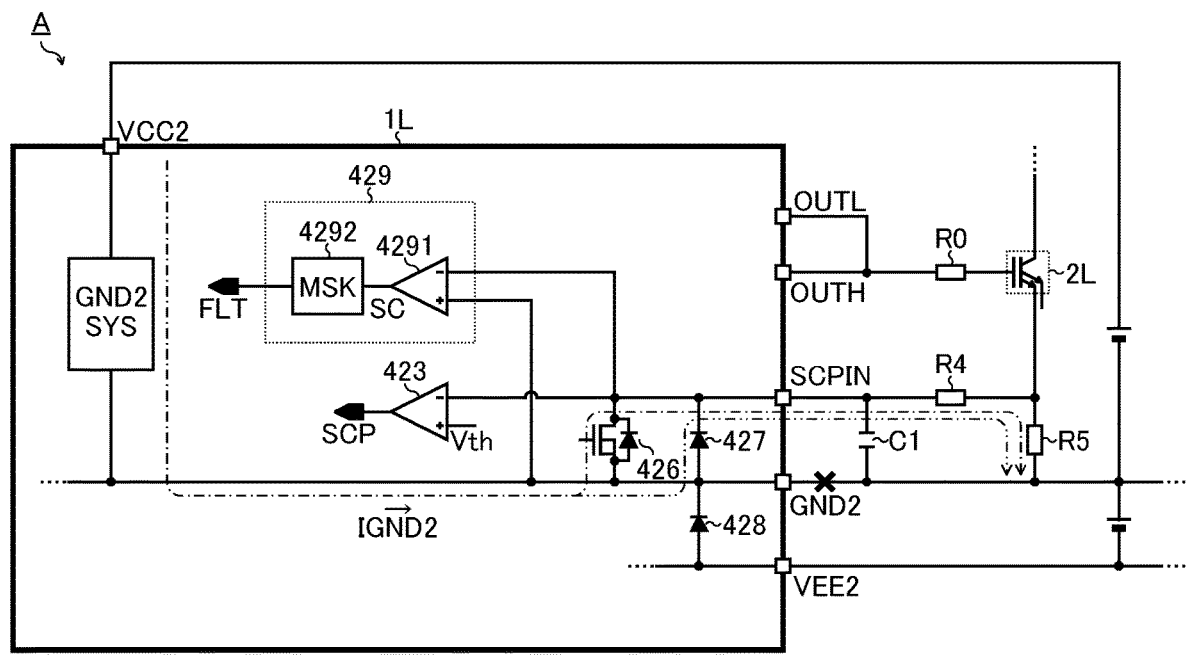
FIG. 14 is a diagram showing one configuration example of an open detection circuit.

FIG. 14 is a diagram showing one configuration example of an open detection circuit. The open detection circuit 429 of this circuit element is a circuit block provided in the driver chip 420 and configured to check whether the ground terminal GND2 of the secondary circuit system 400s is in an open-circuited state. The open detection circuit 429 includes a comparator 4291 and a masking circuit 4292. In the diagram is also shown a diode 428 for electrostatic protection that is connected between the negative power terminal VEE2 and the ground terminal GND2. In the following description, the terminal voltage at the ground terminal GND2 (as it is inside the IC) is occasionally referred to as internal GND2.

The comparator 4291 generates a comparison signal SC by comparing the terminal voltage at the ground terminal GND2, which is fed to the non-inverting terminal (+) of the comparator 4291, with the short detection terminal SCPIN, which is fed to the inverting input terminal (−) of the comparator 4291. The comparison signal SC is at high level when the difference between the terminal voltages at the ground terminal GND2 and the short detection terminal SCPIN (i.e., internal GND2-SCPIN) is higher than a predetermined threshold voltage, and is at low level when the same difference is lower than the predetermined threshold voltage. The comparator 4291 can be given a circuit configuration similar to that of the comparator 423.

The masking circuit 4292 masks the comparison signal SC for a predetermined masking period. In the diagram, for the sake of convenience, the fault signal FLT is shown as if being output directly from the masking circuit 4292; in reality, the output signal of the masking circuit 4292 (corresponding to the result of open detection at the ground terminal GND2) is, along with another fault detection signal on the open detection circuit 429 (e.g., an overheat or load power fault detection signal), subjected to a logic operation and the result is transmitted via the transformer chip 430 to the logic circuit 411 in the controller chip 410 so that the logic circuit 411 then turns on or off the NMOSFET 413 to determine the logic level of the fault signal FLT.

As described above, in this configuration example, the low-side gate driver IC 1L (signal transmission device 400) includes a first external terminal (e.g., the ground terminal GND2) configured such that the ground terminal of the secondary circuit system 400s is connected to it, a second external terminal (e.g., the short detection terminal SCPIN) configured such that the terminal voltage at it varies according to whether the first external terminal is in an open-circuited state, and an open detection circuit 429 configured to monitor the terminal voltage at the second external terminal to detect an open state at the first external terminal.

Now, with reference to FIG. 14 and also FIG. 15, the open detection operation by the open detection circuit 429 will be described in detail.

Figure 15:
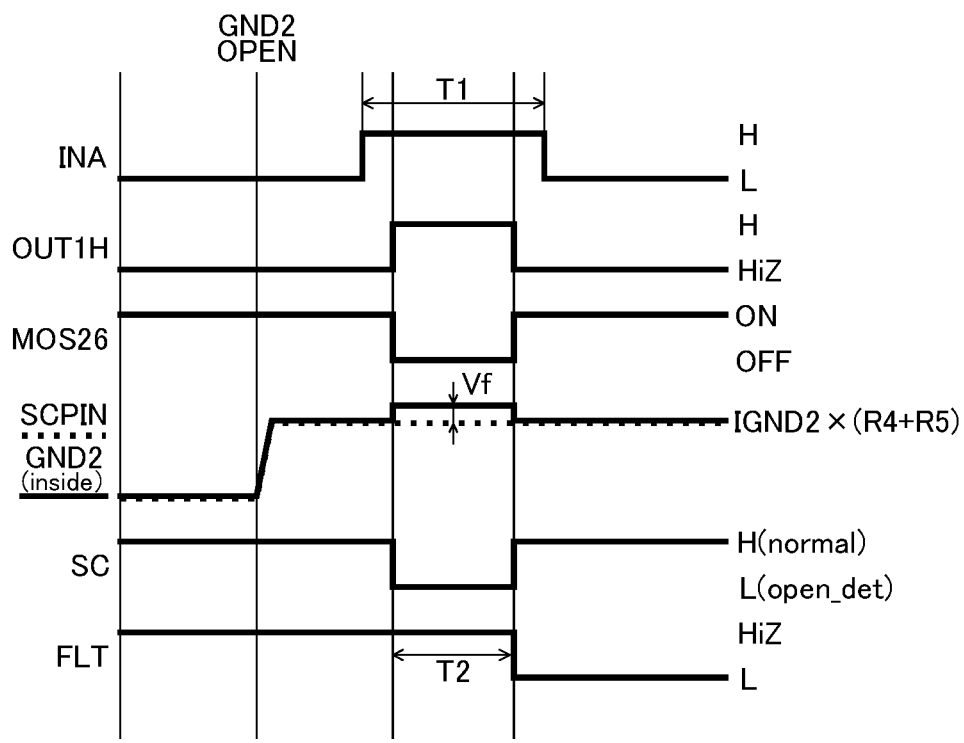
FIG. 15 is a diagram showing one example of open detection operation.

FIG. 15 is a diagram showing one example of open detection operation, depicting, from top down, the input pulse signal INA, the output pulse signal OUT1H, the on/off state of the NMOSFET 426, the terminal voltages at the ground terminal GND2 and the short detection terminal SCPIN (a solid line and a broken line respectively), the comparison signal SC, and the fault signal FLT. In the following description, a distinction is sometimes made between the terminal voltage at the ground terminal GND2 (as it is inside the IC), referred to as internal GND2, and the ground voltage outside the IC, referred to as external GND2.

When the input pulse signal INA is at low level, the output pulse signal OUT1H is also at low level, and thus the low-side power transistor 2L is off (the high-side power transistor 2H is on). In this state, the NMOSFET 426, which functions as a discharge switch for the capacitor C1, is on, and thus the ground terminal GND2 and the short detection terminal SCPIN are short-circuited together. Accordingly, the terminal voltages at the ground terminal GND2 and the short detection terminal SCPIN are approximately equal (SCPIN≈internal GND2). As a result, the comparison signal SC as at high level (the logic level indicating normal condition), and hence the fault signal FLT is at high level (a state where the NMOSFET 413 is off and the fault terminal FLT is at a high impedance).

By contrast, if the ground terminal GND2 goes into an open state, as indicated by a fine dash-and-dot line in FIG. 14, a circuit current IGND2 passes from the power terminal VCC2 to the short detection terminal SCPIN across the circuits (identified as GND2STS in the diagram) in the secondary circuit system 400s, the internal wiring connected to the ground terminal GND2 (i.e., the ground line inside the IC), and the NMOSFET 426 in the on state.

The circuit current IGND2 passes out of the low-side gate driver IC 1L (signal transmission device 400) via the short detection terminal SCPIN to reach, via the resistors R4 and R5, the ground terminal of the secondary circuit system 400s. As a result, the terminal voltage at the short detection terminal SCPIN rises to a voltage value (=IGND2×(R4+R5)) commensurate with the circuit current IGND2 and the resistances R4 and R5 with respect to external GND2. During the low-level period of the output pulse signal OUT1H, however, the NMOSFET 426 is on and thus the terminal voltages at the ground terminal GND2 and the short detection terminal SCPIN remain equal (SCPIN≈internal GND2). Accordingly, the comparison signal SC is kept at high level, and hence the fault signal FLT too remains at high level.

The resistance values of the resistors R4 and R5 are set appropriately such that, when the terminal voltage at the ground terminal GND2 (i.e., internal GND2) is elevated, it does not exceed the withstand voltage of the diode 428 connected between the ground terminal GND2 and the negative power terminal VEE.

Thereafter, when the input pulse signal INA rises to high level, the output pulse signal OUT1H too rises to high level, and thus the low-side power transistor 2L turns on (the high-side power transistor 2H turns off). At this time, the NMOSFET 426 turns off, and thus, as indicated by a fine dash-dot-dot line in FIG. 14, the circuit current IGND2 now passes across the forward-biased diode 427 or across the body diode of the NMOSFET 426.

Accordingly, the terminal voltage at the ground terminal GND2 is higher than the terminal voltage at the short detection terminal SCPIN by the forward drop voltage Vf across the diode 427 (or the body diode of the NMOSFET 426). As a result, the comparison signal SC is at low level (the logic level indicating an open circuit being detected), and hence, in the logic circuit 411 in the controller chip 410, the fault signal FLT is latched at low level (i.e., with the NMOSFET 413 in the on state). The threshold voltage in the comparator 4291 (i.e., the GND2 open detection voltage) can be set appropriately with consideration given to variation of the forward drop voltage Vf (about 0.2 V, lower than the minimum voltage of the forward drop voltage Vf).

In the ECU 3, it is possible, by monitoring the fault signal FLT mentioned above, to detect a fault in the low-side gate driver IC 1L (including an open state at the ground terminal GND2). Incidentally, a condition for cancelling the latching of the fault signal FLT can be, for example, the ECU 3 raising back up the enable signal for the low-side gate driver IC 1L (signal transmission device 400).

As mentioned previously, the open detection circuit 429 includes the masking circuit 4292, and masks the comparison signal SC so as to keep the logic level of the fault signal FLT unchanged after the comparison signal SC is turned to low level until a masking period T2 (e.g., 10 μs at the minimum) elapses. This helps prevent erroneous detection of an open state due to noise.

Incidentally, when the NMOSFET 426 is on, SPIN≈internal GND2, and this makes it impossible to detect an open state at the ground terminal GND2. Put the other way around, an open state at the ground terminal GND2 needs to be detected when the NMOSFET 426 is off. The NMOSFET 426 is off during the high-level period of the output pulse signal OUT1H (hence the on period of the low-side power transistor 2L), and during this period, an open state at the ground terminal GND2 needs to be detected.

For example, suppose that the switching frequency of the output pulse signal OUT1H is 10 kHz and that its duty is 50%. Then the high-level period of the output pulse signal OUT1H is 50 μs (the high-level period T1 of the input pulse signal INA is assumed to be 50 μs or more). With this taken into account, the masking period T2 can be set to be shorter than the on period of the low-side power transistor 2L (e.g., the high-level period T1 of the input pulse signal INA), a preferred setting being T2=20 μs (35 μs at the maximum).

On the other hand, the delay time after an open state is detected until the fault signal FLT is dropped to low level (i.e., the time required for transformer transmission and logic processing) can be about 10 to 36 μs.

The external terminal to which the open detection circuit 429 is connected is not limited to the short detection terminal SCPIN; it may be any external terminal configured such that the terminal voltage at it varies according to whether the ground terminal GND2 is in an open state (e.g., an external terminal that is connected via a diode to the ground terminal GND2 and via which, when the ground terminal GND2 is in an open state, a circuit current passes out from the ground line inside the device via the forward-biased diode.

Accordingly, if the terminal voltage at the short detection terminal SCPIN is not taken as the target of monitoring by the open detection circuit 429, in other words, if there is no element that short-circuits between the external terminal taken as the target of terminal voltage monitoring and the ground terminal GND2, no consideration needs to be given to restrictions as mentioned above on the masking period T2.

Though not illustrated specifically, also if, while the input pulse signal INA is at high level, the ground terminal GND2 goes into an open state, the difference between the terminal voltages at the ground terminal GND2 and the short detection terminal SCPIN (i.e., internal GND2-SCPIN) becomes higher than the predetermined threshold voltage as described above, and thus open detection is possible.

While the above description deals with an example where the fault signal FLT is used to notify the ECU 3 of the result of open detection with respect to the ground terminal GND2, similar notification is possible using, for example, the ready signal RDY. In that case, the output signal of the masking circuit 4292 (corresponding to the result of open detection with respect to the ground terminal GND2) is, along with the UVLO/OVLO detection signal in the driver chip 420, subjected to a logic operation and is then transmitted to the logic circuit 411 in the controller chip 410 so that the logic circuit 411 turns on or off the NMOSFET 414 to determine the logic level of the ready signal RDY.

<Application to Vehicles>

Figure 16:
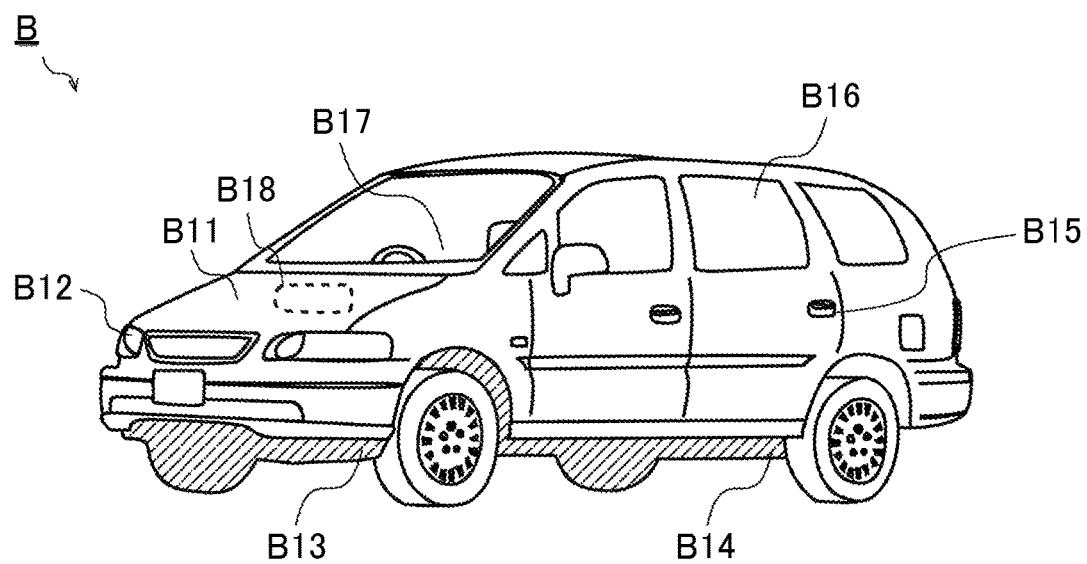
FIG. 16 is a diagram showing the exterior appearance of a vehicle that incorporates an electronic device.

FIG. 16 is a diagram showing the exterior appearance of a vehicle that incorporates an electronic device. The vehicle B of this configuration example incorporates electronic devices B11 to B18 that operate by being supplied with electric power from an unillustrated battery.

The vehicle B can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

For the sake of convenience, in the diagram, the electronic devices B11 to B18 may be shown at places different from where they are actually arranged.

The electronic device B11 is an electronic control unit that performs control with respect to an engine (injection control, electronic throttle control, idling control, oxygen sensor heater control, automatic cruise control, etc.), or an electronic control unit that performs control with respect to a motor (torque control, electric power regeneration control, etc.).

The electronic device B12 is a lamp control unit that controls the lighting and extinguishing of HIDs (high-intensity discharged lamps), DRLs (daytime running lamps), and the like.

The electronic device B13 is a transmission control unit that performs control with respect to a transmission.

The electronic device B14 is a movement control unit that performs control with respect to the movement of the vehicle B (ABS [anti-lock brake system] control, EPS [electric power steering] control, electronic suspension control, and the like).

The electronic device B15 is a security control unit that drives and controls door locks, burglar alarms, and the like.

The electronic device B16 comprises electronic devices incorporated in the vehicle B as standard or manufacturer-fitted equipment at the stage of factory shipment, such as wipers, power side mirrors, power windows, dampers (shock absorbers), a power sun roof, and power seats.

The electronic device B17 comprises electronic devices fitted to the vehicle B optionally as user-fitted equipment, such as A/V (audio/visual) equipment, a car navigation system, and an ETC (electronic toll control system).

The electronic device B18 comprises electronic devices provided with high-withstand-voltage motors, such as a vehicle-mounted blower, an oil pump, a water pump, and a battery cooling fan.

The electronic devices B11 to B18 can be understood as specific examples of the electronic device A described previously. That is, either of the signal transmission devices 200 and 400 described previously can be built into any of the electronic devices B11 to B18.

Overview

To follow is an overview of the various embodiments described above.

For example, according to one aspect of what is disclosed herein, a signal transmission device is configured to transmit a driving signal for a gate-driving transistor between a primary circuit system and a secondary circuit system while isolating between the primary and secondary circuit systems, and includes: a first external terminal configured such that the ground terminal of the secondary circuit system is connected to it; a second external terminal configured such that the terminal voltage at it varies according to whether the first external terminal is in an open state; and an open detection circuit configured to monitor the terminal voltage at the second external terminal to perform open detection with respect to the first external terminal. (A first configuration.)

In the signal transmission device of the first configuration described above, there may further be provided a diode of which the anode is connected to the first external terminal and of which the cathode is connected to the second external terminal. (A second configuration.)

In the signal transmission device of the first or second configuration described above, there may further be provided a discharge switch configured to switch the path between the first and second external terminals between a conducting state and a cut-off state complementarily with the gate-driving transistor. (A third configuration.)

In the signal transmission device of the third configuration described above, the open detection circuit may be configured to perform the open detection while the discharge switch is off. (A fourth configuration.)

In the signal transmission device of any of the first to fourth configurations described above, the open detection circuit may include a comparator configured to generate a comparison signal by comparing the terminal voltages at the first and second external terminals with each other. (A fifth configuration.)

In the signal transmission device of the fifth configuration described above, the open detection circuit may further include a masking circuit configured to mask the comparison signal for a masking period. (A sixth configuration.)

In the signal transmission device of the sixth configuration described above, the masking period may be shorter than the on period of the gate-driving transistor. (A seventh configuration.)

In the signal transmission device of any of the first to seventh configurations described above, the open detection circuit may be configured to subject the result of the open detection with respect to the first external terminal to a logical operation with another fault detection signal and output the result of the logical operation. (A eighth configuration.)

In the signal transmission device of any of the first to eighth configurations described above, a first chip having integrated on it the circuit elements of the primary circuit system, a second chip having integrated on it circuit the elements of the secondary circuit system, and a third chip having integrated on it an isolating element configured to isolate between the primary and secondary circuit systems may be sealed in a single package. (A ninth configuration.)

According to another aspect of what is disclosed herein, an electronic device includes: a power transistor; and a gate driver IC configured to drive a gate of the power transistor. Here, the gate driver IC is the signal transmission device according to any of the first to ninth configurations described above. (A tenth configuration.)

According to yet another aspect of what is disclosed herein, a vehicle includes the electronic device according to the tenth configuration described above. (An eleventh configuration.)

Other Modifications

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope and sense equivalent to those claims.

| Reference Signs List | |
|---|---|
| 1H(u/v/w) | high-side gate driver IC |
| 1L(u/v/w) | low-side gate driver IC |
| 2H(u/v/w) | high-side power transistor |
| 2L(u/v/w) | low-side power transistor |
| 3 | ECU |
| 4 | motor |
| 5 | semiconductor device |
| 11, 11A-11F | low-potential |
| 12, 12A-12F | high-potential terminal |
| 21, 21A-21D | transformer |
| 22 | low potential coil (primary coil) |
| 23 | high potential coil (secondary coil) |
| 24 | first inner end |
| 25 | first outer end |
| 26 | first spiral portion |
| 27 | second inner end |
| 28 | second outer end |
| 29 | second spiral portion |
| 31 | first low-potential wiring |
| 32 | second low-potential wiring |
| 33 | first high-potential wiring |
| 34 | second high-potential wiring |
| 41 | semiconductor chip |
| 42 | first principal surface |
| 43 | second principal surface |
| 44A-44D | chip side wall |
| 45 | first functional device |
| 51 | insulation layer |
| 52 | insulation principal surface |
| 53A-53D | insulation side wall |
| 55 | bottom insulation layer |
| 56 | top insulation layer |
| 57 | interlayer insulation layer |
| 58 | first insulation layer |
| 59 | second insulation layer |
| 60 | second functional device |
| 61 | sealing conductor |
| 62 | device region |
| 63 | outer region |
| 64 | sealing plug conductor |
| 65 | sealing via conductor |
| 66 | first inner region |
| 67 | second inner region |
| 71 | through wiring |
| 72 | low-potential connection wiring |
| 73 | lead wiring |
| 74 | first connection plug electrode |
| 75 | second connection plug electrode |
| 76 | pad plug electrode |
| 77 | substrate plug electrode |
| 78 | first electrode layer |

-continued

| Reference Signs List | |
|---|---|
| 79 | second electrode layer |
| 80 | wiring plug electrode |
| 81 | high-potential connection wiring |
| 82 | pad plug electrode |
| 85 | dummy pattern |
| 86 | high-potential dummy pattern |
| 87 | first high-potential dummy pattern |
| 88 | second high-potential dummy pattern |
| 89 | first region |
| 90 | second region |
| 91 | third region |
| 92 | first connection part |
| 93 | first pattern |
| 94 | second pattern |
| 95 | third pattern |
| 96 | first outer circumferential line |
| 97 | second outer circumferential line |
| 98 | first middle line |
| 99 | first connection line |
| 100 | slit |
| 130 | separation structure |
| 140 | inorganic insulation layer |
| 141 | first inorganic insulation layer |
| 142 | second inorganic insulation layer |
| 143 | low-potential pad opening |
| 144 | high-potential pad opening |
| 145 | organic insulation layer |
| 146 | first part |
| 147 | second part |
| 148 | low-potential terminal opening |
| 149 | high-potential terminal opening |
| 200 | signal transmission device |
| 200p | primary circuit system |
| 200s | secondary circuit system |
| 210 | controller chip (first chip) |
| 211 | pulse transmission circuit (pulse generator) |
| 212, 213 | buffer |
| 220 | driver chip (second chip) |
| 221, 222 | buffer |
| 223 | pulse reception circuit (RS flip-flop) |
| 224 | driver |
| 230 | transformer chip (third chip) |
| 230a | first wiring layer (lower layer) |
| 230b | second wiring layer (upper layer) |
| 231, 232 | transformer |
| 231p, 232p | primary coil |
| 231s, 232s | secondary coil |
| 300 | transformer chip |
| 301 | first transformer |
| 302 | second transformer |
| 303 | third transformer |
| 304 | fourth transformer |
| 305 | first guard ring |
| 306 | second guard ring |
| 400 | signal transmission device (isolated gate driver IC) |
| 400p | primary circuit system |
| 400s | secondary circuit system |
| 410 | controller chip |
| 411 | logic circuit |
| 412 | UVLO/OVLO circuit |
| 413, 414 | NMOSFET |
| 420 | driver chip |
| 421 | logic circuit |
| 422 | UVLO/OVLO circuit |
| 423 | comparator |
| 424 | PMOSFET |
| 425 | NMOSFET |
| 426 | NMOSFET (discharge switch) |
| 427, 428 | diode |
| 429 | open detection circuit |
| 4291 | comparator |
| 4292 | masking circuit |
| 430 | transformer chip |
| A | electronic device |
| B | vehicle |
| B11-B18 | electronic device |

-continued

| Reference Signs List | |
|---|---|
| C1 | capacitor |
| D1 | diode |
| a1-a8 | pad (corresponding to first current feed pad) |
| b1-b8 | pad (corresponding to first voltage measurement pad) |
| c1-c4 | pad (corresponding to second current feed pad) |
| d1-d4 | pad (corresponding to second voltage measurement pad) |
| e1, e2 | pad |
| L1s, L2s, L3s, L4s | secondary coil |
| R0, R1, R2, R3, R4, R5 | resistor |
| T21, T22, T23, T24, T25, T26 | external terminal |
| X | first direction |
| X21, X22, X23 | internal terminal |
| Y | second direction |
| Y21, Y22, Y23 | wiring |
| Z | normal direction |
| Z21, Z22, Z23 | via |

The invention claimed is:

1. A signal transmission device configured to transmit a driving signal for a gate-driving transistor between a primary circuit system and a secondary circuit system while isolating between the primary and secondary circuit systems, the signal transmission device comprising:
   a first external terminal configured such that a ground terminal of the secondary circuit system is connected thereto;
   a second external terminal configured such that a terminal voltage thereat varies according to whether the first external terminal is in an open state; and
   an open detection circuit configured to monitor a terminal voltage at the second external terminal to perform open detection with respect to the first external terminal.

2. The signal transmission device according to claim 1, further comprising a diode of which an anode is connected to the first external terminal and of which a cathode is connected to the second external terminal.

3. The signal transmission device according to claim 1, further comprising a discharge switch configured to switch a path between the first and second external terminals between a conducting state and a cut-off state complementarily with the gate-driving transistor.

4. The signal transmission device according to claim 3, wherein
   the open detection circuit is configured to perform the open detection while the discharge switch is off.

5. The signal transmission device according to claim 1, wherein
   the open detection circuit includes a comparator configured to generate a comparison signal by comparing the terminal voltages at the first and second external terminals with each other.

6. The signal transmission device according to claim 5, wherein
   the open detection circuit further includes a masking circuit configured to mask the comparison signal for a masking period.

7. The signal transmission device according to claim 6, wherein
   the masking period is shorter than an on period of the gate-driving transistor.

8. The signal transmission device according to claim 1, wherein
   the open detection circuit is configured to subject a result of the open detection with respect to the first external terminal to a logical operation with another fault detection signal and output a result of the logical operation.

9. The signal transmission device according to claim 1, wherein
   a first chip having integrated thereon circuit elements of the primary circuit system,
   a second chip having integrated thereon circuit elements of the secondary circuit system, and
   a third chip having integrated thereon an isolating element configured to isolate between the primary and secondary circuit systems
   are sealed in a single package.

10. An electronic device comprising:
    a power transistor; and
    a gate driver IC configured to drive a gate of the power transistor,
    wherein the gate driver IC is the signal transmission device according to claim 1.

11. A vehicle comprising the electronic device according to claim 10.

* * * * *